US012795908B2

(12) United States Patent
Kawaguchi

(10) Patent No.: US 12,795,908 B2
(45) Date of Patent: Nov. 10, 2026

(54) 3D MEMORY DEVICE WITH TAPERED DIVIDING PLATE

(71) Applicant: Kioxia Corporation, Tokyo (JP)

(72) Inventor: Yuuko Kawaguchi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 564 days.

(21) Appl. No.: 18/334,010

(22) Filed: Jun. 13, 2023

(65) Prior Publication Data

US 2023/0413543 A1 Dec. 21, 2023

(30) Foreign Application Priority Data

Jun. 21, 2022 (JP) ................................ 2022-099738

(51) Int. Cl.

| | |
|---|---|
| ***H10B 41/27*** | (2023.01) |
| ***H10B 41/41*** | (2023.01) |
| ***H10B 43/27*** | (2023.01) |
| ***H10B 43/40*** | (2023.01) |
| ***H10W 20/41*** | (2026.01) |
| ***H10W 20/42*** | (2026.01) |

(52) U.S. Cl.

CPC ............. *H10B 41/27* (2023.02); *H10B 41/41* (2023.02); *H10B 43/27* (2023.02); *H10B 43/40* (2023.02); *H10W 20/42* (2026.01); *H10W 20/435* (2026.01)

(58) Field of Classification Search

CPC ...................................................... H10B 41/27

See application file for complete search history.

(56) References Cited

U.S. PATENT DOCUMENTS

| | | | | |
|---|---|---|---|---|
| 11,043,469 | B1 | 6/2021 | Shih | |
| 2021/0143166 | A1* | 5/2021 | Chen | G11C 8/14 |
| 2021/0249434 | A1 | 8/2021 | Nishikawa | |
| 2022/0069093 | A1 | 3/2022 | Tagami et al. | |
| 2022/0077182 | A1* | 3/2022 | Lee | H10B 43/27 |
| 2022/0359561 | A1* | 11/2022 | Yang | G11C 16/0483 |

FOREIGN PATENT DOCUMENTS

| | | | | |
|---|---|---|---|---|
| JP | 2002-246554 | A | 8/2002 | |
| JP | 2011-151138 | A | 8/2011 | |
| JP | 2022-040975 | A | 3/2022 | |
| TW | 202131491 | A | 8/2021 | |
| TW | 202133401 | A | 9/2021 | |
| WO | WO-2021247084 | A1 * | 12/2021 | H10B 43/50 |

* cited by examiner

*Primary Examiner* — Peter Bradford

(74) *Attorney, Agent, or Firm* — Kim & Stewart LLP

(57) ABSTRACT

A semiconductor storage device includes a stacked body where a conductive layer and an insulating layer are stacked a multiple number of times; a plate-shaped portion extending along a stacking direction of the stacked body and a first direction and dividing the stacked body along a second direction; and a pillar penetrating the stacked body. A width of the plate-shaped portion in the second direction at the same height as a conductive layer located at the top is larger than a width of the plate-shaped portion in the second direction at the same height as a conductive layer located at the bottom, and a width of the pillar in the second direction at the same height as the conductive layer located at the top is smaller than a width of the pillar in the second direction at the same height as the conductive layer located at the bottom.

11 Claims, 18 Drawing Sheets

3D MEMORY DEVICE WITH TAPERED DIVIDING PLATE

CROSS-REFERENCE TO RELATED APPLICATION

This application is based upon and claims the benefit of priority from Japanese Patent Application No. 2022-099738, filed Jun. 21, 2022, the entire contents of which are incorporated herein by reference.

FIELD

Embodiments described herein relate generally to a semiconductor storage device and a semiconductor storage device manufacturing method.

BACKGROUND

In a semiconductor storage device such as a three-dimensional nonvolatile memory, layouts of memory cells are densely disposed in a stacked body where a plurality of conductive layers and a plurality of insulating layers are stacked alternately. In such a semiconductor storage device, electrical contacts between the layouts may adversely affect the characteristics of the semiconductor storage device.

DETAILED DESCRIPTION

Embodiments provide a semiconductor storage device and a semiconductor storage device manufacturing method in which inter-layout contact can be prevented.

In general, according to one embodiment, a semiconductor storage device includes: a stacked body where a conductive layer and an insulating layer are stacked a multiple number of times from a bottom to a top; a plate-shaped portion extending along a stacking direction of the stacked body and a first direction intersecting the stacking direction and dividing the stacked body along a second direction intersecting the stacking direction and the first direction; and a pillar penetrating the stacked body and extending along the stacking direction. A width of the plate-shaped portion in the second direction at the same height as a conductive layer located at the top of the stacked body is larger than a width of the plate-shaped portion in the second direction at the same height as a conductive layer located at the bottom of the stacked body, and a width of the pillar in the second direction at the same height as the conductive layer located at the top of the stacked body is smaller than the width of the pillar in the second direction at the same height as the conductive layer located at the bottom of the stacked body.

Hereinafter, an embodiment of the present disclosure will be described in detail with reference to the drawings. It should be noted that the present disclosure is not limited by description of the following embodiment. In addition, components of the embodiment in the following description include those that can be easily implemented by those skilled in the art or substantially identical components.

Configuration Example of Semiconductor Storage Device

Figure 1:
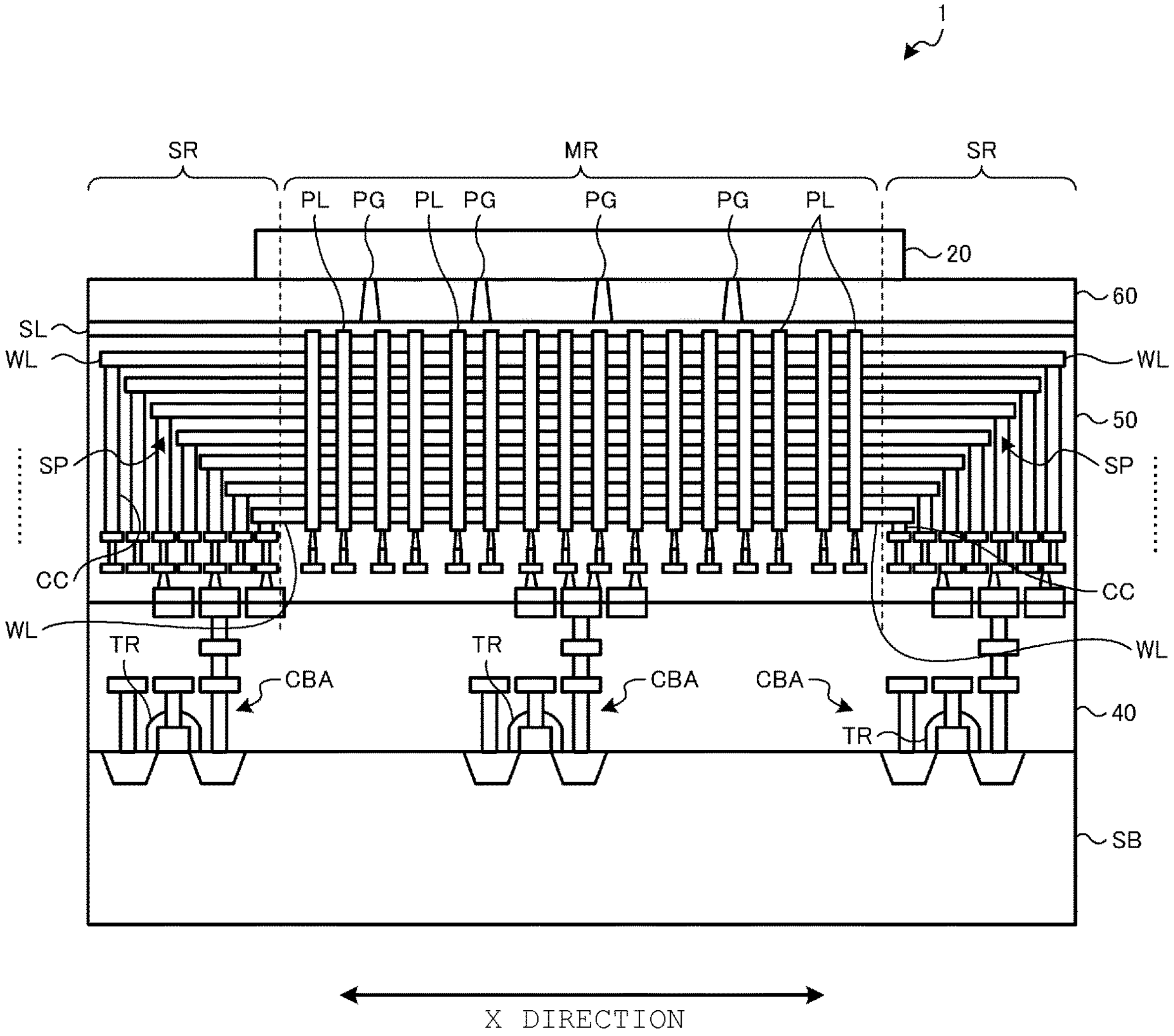
FIG. 1 is a cross-sectional view along an X direction illustrating a schematic configuration example of a semiconductor storage device according to an embodiment.

FIG. 1 is a cross-sectional view along an X direction illustrating a schematic configuration example of a semiconductor storage device 1 according to the embodiment. However, in FIG. 1, hatching is omitted in view of the visibility of the drawing.

It should be noted that in this specification, both the X direction and a Y direction are along the direction of the plane of a word line WL, which will be described later, and the X direction and the Y direction are orthogonal to each other. In addition, the electrical lead direction of the word line WL, which will be described later, may be referred to as a first direction, and this first direction is along the X direction. In addition, a direction intersecting the first direction may be referred to as a second direction, and this second direction is along the Y direction. It is noted that the semiconductor storage device 1 may include a manufacturing error, and thus the first direction and the second direction may not be necessarily orthogonal.

As illustrated in FIG. 1, the semiconductor storage device 1 includes peripheral circuits CBA, a plurality of the word lines WL, a source line SL, and a conductive layer 20 in this order above a semiconductor substrate SB. It is assumed that in the description of the configuration example of the semiconductor storage device 1, a side where the semiconductor substrate SB is disposed is a lower side of the semiconductor storage device 1.

The semiconductor substrate SB is, for example, a silicon substrate or the like. The peripheral circuit CBA including, for example, a transistor TR and wiring is disposed on the semiconductor substrate SB. The peripheral circuit CBA contributes to the operation of a memory cell, which will be described later.

The peripheral circuit CBA is covered with an insulating layer 40. The plurality of word lines WL are stacked above the insulating layer 40. The plurality of word lines WL are bonded to the insulating layer 40 covering the peripheral circuit CBA via an insulating layer 50. The insulating layer 50 spreads around the plurality of word lines WL as well. A memory region MR is disposed in the middle portion of the plurality of word lines WL, and stair regions SR are disposed at both end portions in the X direction.

A plurality of pillars PL penetrating the word lines WL in the stacking direction are disposed in the memory region MR. The intersections of the pillars PL and the word lines WL are each a location of a memory cell. As a result, the semiconductor storage device 1 is configured as, for example, a three-dimensional nonvolatile memory in which memory cells are three-dimensionally disposed in the memory region MR.

In the stair regions SR, both end portions of the plurality of word lines WL in the X direction are processed in a stair shape. In other words, both end portions of the plurality of word lines WL in the X direction spread further in the X direction the closer they are to the source line SL. Contacts CC connected to the word lines WL of the respective layers are respectively disposed at both end portions of the respective layers of the plurality of word lines WL in the X direction.

By these contacts CC, the word lines WL stacked in multiple layers are electrically connected individually. From these contacts CC, a write voltage, a read voltage, and the like are applied to the memory cells in the memory region MR in the middle portion of the plurality of word lines WL via the word lines WL at the same height positions as the memory cells.

Various voltages applied from the contacts CC to the memory cells are controlled by the peripheral circuits CBA electrically connected to these contacts CC.

The source line SL is disposed above the plurality of word lines WL. The conductive layer 20 is disposed above the source line SL via an insulating layer 60. A plurality of plugs PG are disposed in the insulating layer 60, and conduction is maintained between the source line SL and the conductive layer 20 via the plugs PG. As a result, a source potential can be applied to the source line SL from the outside of the semiconductor storage device 1 via the conductive layer 20 and the plugs PG.

Next, a detailed configuration example of the semiconductor storage device 1 will be described with reference to FIGS. 2A to 2D.

Figure 2A:
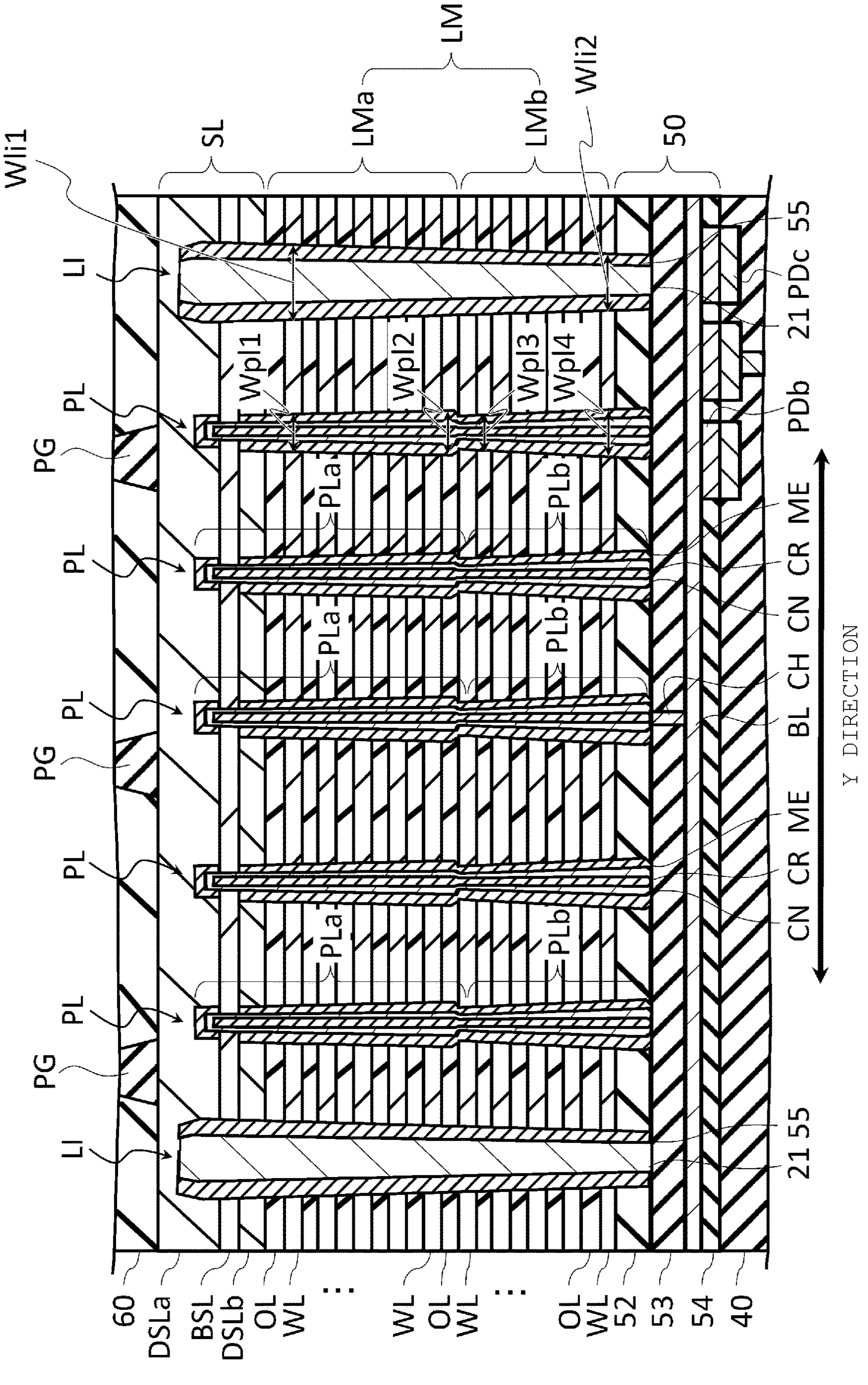
FIGS. 2A to 2D are cross-sectional views along a Y direction illustrating an example of the configuration of the semiconductor storage device according to the embodiment.
Figure 2B:
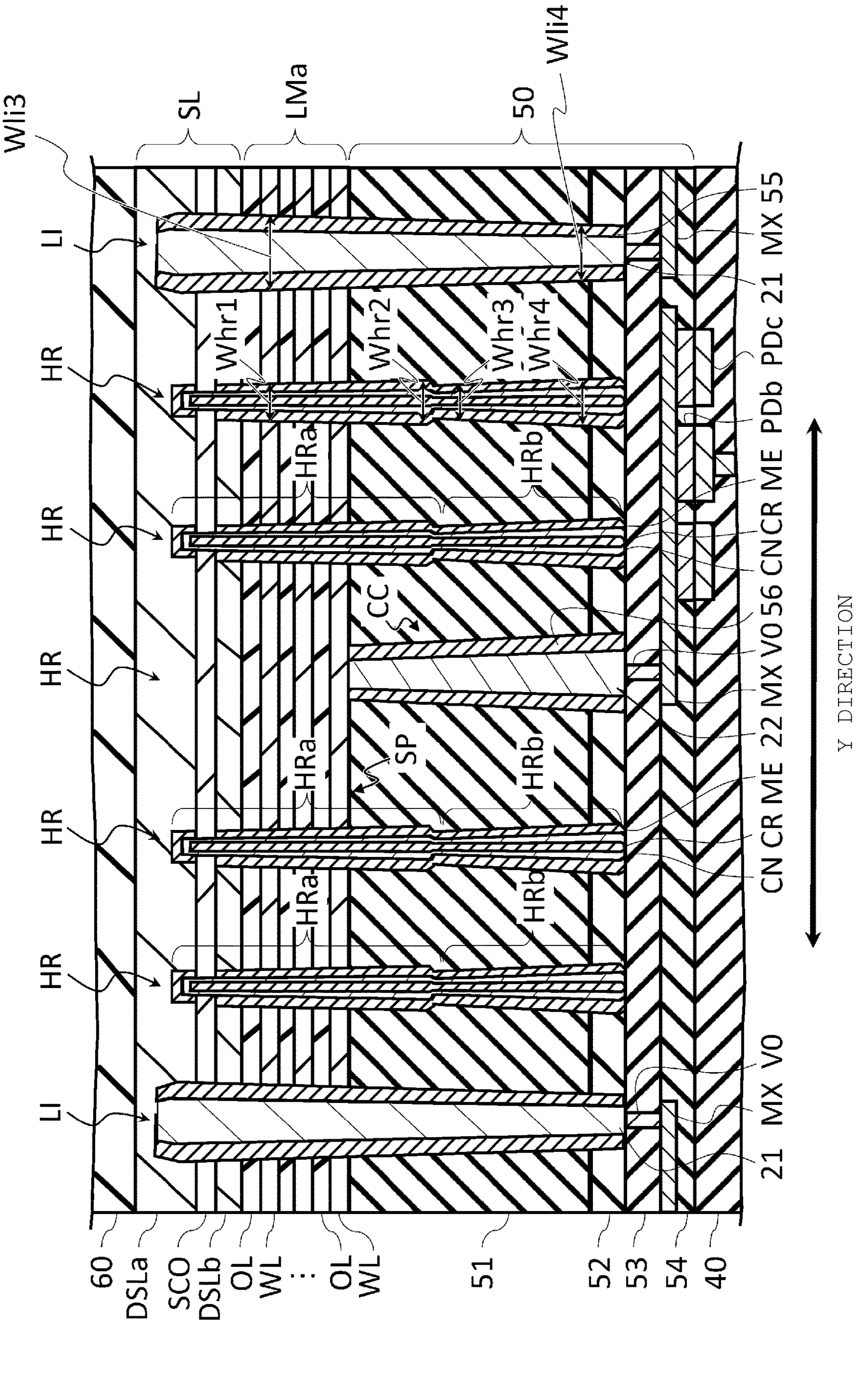

FIG. 2A is a cross-sectional view along the Y direction including the memory region MR. FIG. 2B is a cross-sectional view along the Y direction including the stair region SR. It is noted that, in FIGS. 2A and 2B, structures below the insulating layer 40, such as the semiconductor substrate SB and the peripheral circuit CBA, and structures above the insulating layer 60, such as the conductive layer 20, are omitted.

Figure 2D:
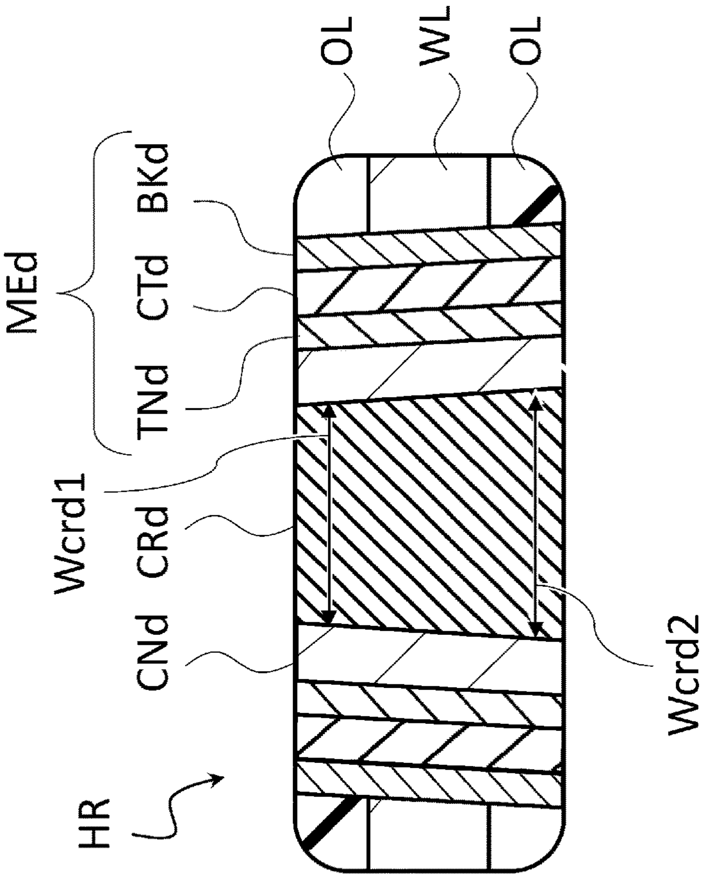
Figure 2C:
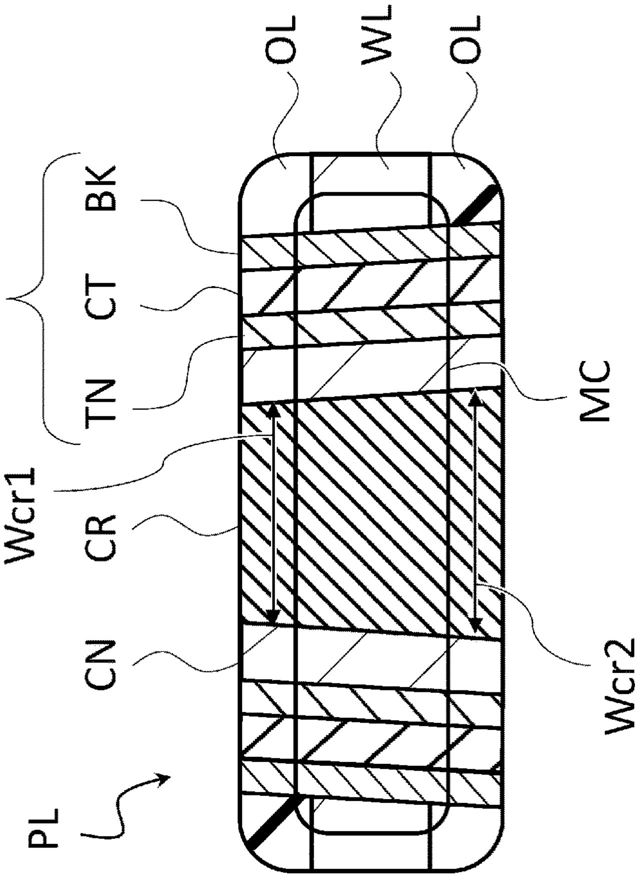

FIG. 2C is a partially enlarged view illustrating a cross section of the pillar PL disposed in the memory region MR. FIG. 2D is a partially enlarged view illustrating a cross section of a columnar portion HR disposed in the stair region SR.

As illustrated in FIGS. 2A and 2B, insulating layers 54, 53, and 52 are disposed in this order above the insulating layer 40 covering the peripheral circuit CBA. In addition, as illustrated in FIG. 2B, an insulating layer 51 is interposed between these insulating layers 54, 53, and 52 and a stacked body LM (FIG. 2A) in the stair region SR. These insulating layers 51 to 54 configure a part of the insulating layer 50 of FIG. 1.

The stacked body LM is disposed above the insulating layer 52 with the insulating layer 51 interposed in a partial region. In the stacked body LM, the plurality of word lines WL and a plurality of insulating layers OL are alternately stacked layer by layer.

More specifically, the stacked body LM includes a stacked body LMa and a stacked body LMb. The stacked body LMb is a second stacked body in which the plurality of word lines WL and the plurality of insulating layers OL are alternately stacked on the insulating layer 52 layer by layer. The stacked body LMa is a first stacked body in which the plurality of word lines WL and the plurality of insulating layers OL are alternately stacked on the stacked body LMb layer by layer.

Select gate lines may be stacked via the insulating layers OL in a layer further below the word line WL in the lowermost layer of the stacked body LMb and in a layer further above the word line WL in the uppermost layer of the stacked body LMa. In this embodiment, the word line WL of the lowest layer of the stacked body LMb is the word line WL located at the bottom of the stacked body LM. The word line WL of the uppermost layer of the stacked LMa is the word line WL located at the top of the stacked body LM. Any number of the word lines WL and the select gate lines may be stacked in the stacked body LM.

The word lines WL are a plurality of conductive layers in the stacked body LM and are, for example, tungsten layers or molybdenum layers. The insulating layers OL are a plurality of insulating layers in the stacked body LM and are, for example, silicon oxide layers.

The source line SL is disposed on the stacked body LM. The source line SL has, for example, a multilayer structure in which a source line DSLb, an intermediate source line BSL or an intermediate insulating layer SCO, and a source line DSLa are stacked in this order from the stacked body LM side.

The source line DSLb, the intermediate source line BSL, and the source line DSLa are, for example, polysilicon layers. Among the source line DSLb, the intermediate source line BSL, and the source line DSLa, at least the intermediate source line BSL may be, for example, a conductive polysilicon layer in which impurities are diffused. The intermediate source line BSL is disposed above the memory region MR of the stacked body LM. The intermediate insulating layer SCO is a silicon oxide layer or the like. The intermediate insulating layer SCO is disposed above, for example, the stair region SR of the stacked body LM except for the memory region MR.

The stacked body LM is divided in the Y direction by a plurality of plate-shaped contacts LI.

The plate-shaped contacts LI are plate-shaped portions that are mutually aligned in the Y direction and extend in the stacking direction of the stacked body LM and along the X direction. In other words, the plate-shaped contacts LI continuously extend in the stacked body LM from one end portion to the other end portion of the stacked body LM in the X direction. As a result, the stacked body LM is divided in the Y direction by the plate-shaped contacts LI.

More specifically, in the memory region MR, the plate-shaped contact LI reaches the insulating layer 53 from the inside of the source line DSLa by penetrating the intermediate source line BSL, the source line DSLb, the stacked body LM, and the insulating layer 52. In addition, in the stair region SR, the plate-shaped contact LI reaches the insulating layer 53 from the inside of the source line DSLa by penetrating the intermediate insulating layer SCO, the source line DSLb, at least a part of the stacked body LM, the insulating layer 51, and the insulating layer 52.

In addition, the plate-shaped contact LI has, for example, a tapered shape in which the width in the Y direction decreases from the upper end portion toward the lower end portion. Alternatively, the plate-shaped contact LI has, for example, a bow shape in which the width in the Y direction is maximum at a predetermined position between the upper end portion and the lower end portion. In this case, the width in the Y direction decreases toward the lower end portion from the part of the plate-shaped contact LI with the maximum width in the Y direction. In other words, the plate-shaped contact LI have different widths depending on its position in the stacking direction. For example, the plate-shaped contact LI has a width Wli1, which is the width in the Y direction at the same height as the word line WL located at the top of the stacked body LM. The plate-shaped contact LI has a width Wli2, which is the width in the Y direction at the same height as the word line WL located at the bottom of the stacked body LM. The width Wli1 is larger than the width Wli2. In FIG. 2A, the part of the plate-shaped contact LI with the maximum width in the Y direction is located at the same height as the source line DSLa, but the location of the maximum width is not limited to this. The part of the plate-shaped contact LI with the maximum width in the Y direction may, for example, be between the word line WL located at the top of the stacked body LM and the word line WL located at the bottom of the stacked body LM.

Therefore, regardless of whether the plate-shaped contact LI has a tapered shape or a bow shape, the plate-shaped contact LI has a tapered part from one end side of the stacked body LM close to the source line SL to the other end side close to the insulating layer 52. In addition, regardless of whether the plate-shaped contact LI has a tapered shape or a bow shape, the plate-shaped contact LI has the maximum width in the Y direction on the one end side of the stacked body LM.

In addition, each plate-shaped contact LI includes an insulating layer 55 and a conductive layer 21. The insulating layer 55 is, for example, a silicon oxide layer. The conductive layer 21 is, for example, a tungsten layer or a conductive polysilicon layer.

The insulating layer 55 covers the side walls of the plate-shaped contact LI facing each other in the Y direction. The insulating layer 55 is filled with the conductive layer 21. The conductive layer 21 is electrically connected to the source line SL including the intermediate source line BSL as illustrated in FIG. 2A. In addition, as illustrated in FIG. 2B, the conductive layer 21 is connected to wiring MX disposed in the insulating layer 54 via a plug VO disposed in the insulating layer 53.

The wiring MX is electrically connected to the peripheral circuit CBA (see FIG. 1) covered with the insulating layer 40 via an electrode pad (not illustrated) or the like. With such a configuration, the plate-shaped contact LI functions as a source line contact.

As illustrated in FIG. 2A, the pillars PL extending in the stacked body LM in the stacking direction of the stacked body LM are dispersed between the individual plate-shaped contacts LI of the memory region MR. In other words, the pillar PL reaches the insulating layer 53 from the inside of the source line DSLa by penetrating the intermediate source line BSL, the source line DSLb, the stacked body LM, and the insulating layer 52.

More specifically, the pillar PL includes a pillar PLa extending in the stacked body LMa and a pillar PLb extending in the stacked body LMb.

The pillar PLa reaches the stacked body LMb from the inside of the source line DSLa by penetrating the intermediate source line BSL, the source line DSLb, and the stacked body LMa. The pillar PLa has, for example, a tapered shape in which the width in the Y direction increases from the upper end portion toward the lower end portion. Alternatively, the pillar PLa has, for example, a bow shape in which the width in the Y direction is maximum at a predetermined position between the upper end portion and the lower end portion. In this case, the width in the Y direction increases toward the part with the maximum width from the upper end portion of the pillar PLa to the part with the maximum width in the Y direction. In other words, the pillar PLa have different widths depending on its position in the stacking direction. For example, the pillar PLa has a width Wp11, which is the width in the Y direction at a first position which is at a first distance from the top of pillar PL. The pillar PLa has a width Wp12, which is the width in the Y direction at a second position which is at a second distance from the top of pillar PL. The second distance is farther from the top of the pillar PL than the first distance. The width Wpl1 is smaller than the width Wp12. In FIG. 2A, the width Wpl1 is, for example, the width in the Y direction of the pillar PLa at the same height as the word line WL located at the top of the stacked body LM. In FIG. 2A, the part of pillar PLa with the maximum width in the Y direction is located on the bottom of the stacked body LMa.

Therefore, regardless of whether the pillar PLa has a tapered shape or a bow shape, the pillar PLa has a tapered part directed from one end side of the stacked body LMa close to the source line SL to the other end side of the stacked body LMa close to the stacked body LMb. In addition, regardless of whether the pillar PLa has a tapered shape or a bow shape, the pillar PLa has the maximum width in the Y direction on the other end side away from the one end portion of the stacked body LMa. In FIG. 2A, the width of pillar PLa in the Y direction is described, but the width of pillar PLa in the X direction differs along the stacking direction in the same manner.

The pillar PLb reaches the insulating layer 53 from the end portion of the stacked body LMb on the stacked body LMa side by penetrating the stacked body LMb and the insulating layer 52. The pillar PLb has, for example, a tapered shape in which the width in the Y direction increases from the upper end portion toward the lower end portion. Alternatively, the pillar PLb has, for example, a bow shape in which the width in the Y direction is maximum at a predetermined position between the upper end portion and the lower end portion. In this case, the width in the Y direction increases toward the part with the maximum width from the upper end portion of the pillar PLb to the part with the maximum width in the Y direction. In other words, the pillar PLb has a width Wp13, which is the width in the Y direction at a third position which is at a third distance from the top of pillar PL. The pillar PLb has a width Wp14, which is the width in the Y direction at a fourth position which is at a fourth distance from the top of pillar PL. The third distance is farther from the top of the pillar PL than the second distance. The fourth distance is farther from the top of the pillar PL than the third distance. The width Wp13 is smaller than the width Wp14. The width Wp12 is larger than the width Wp13. In FIG. 2A, the width Wp14 is, for example, the width in the Y direction of the pillar PLb at the same height as the word line WL located at the bottom of the stacked body LM. The width Wpl1 is smaller than the width Wp14. In FIG. 2A, the part of the pillar PLb with the maximum width in the Y direction is located at the same height as the insulating layer 52, but the location of the maximum width is not limited to this. The part of the pillar PLb with the maximum width in the Y direction may, for example, be located on the bottom of the stacked body LMb.

Therefore, regardless of whether the pillar PLb has a tapered shape or a bow shape, the pillar PLb has a tapered part directed from one end side of the stacked body LMb close to the stacked body LMa to the other end side of the stacked body LMb close to the insulating layer 52. In addition, regardless of whether the pillar PLb has a tapered shape or a bow shape, the pillar PLb has the maximum width in the Y direction on the other end side away from the one end portion of the stacked body LMb. In FIG. 2A, the width of pillar PLb in the Y direction is described, but the width of pillar PLb in the X direction differs along the stacking direction in the same manner.

In this manner, the part where the plate-shaped contact LI has the maximum width in the Y direction and the parts where the individual pillars PLa and PLb have the maximum widths in the Y direction are disposed at different positions in the stacking direction. As a result, among the plurality of pillars PL dispersed between the plate-shaped contacts LI, even at the pillars PL that are adjacent to the plate-shaped contacts LI, interference such as contact with the plate-shaped contact LI is prevented.

The plurality of pillars PL are disposed in, for example, a staggered shape when viewed from the stacking direction of the stacked body LM. Each pillar PL has, for example, a shape such as a circular shape, an elliptical shape, and an oval shape as a cross-sectional shape in the direction along the layer direction of the stacked body LM, that is, the direction along the XY plane.

Therefore, the cross-sectional area and diameter of the pillar PL in the direction along the XY plane also change in the stacking direction of the stacked body LM in accordance with the shapes of the pillars PLa and PLb. In other words, as the pillars PLa and PLb decrease in width in the Y direction and width in the X direction, the cross-sectional area and diameter in the direction along the XY plane also decrease. In addition, as the pillars PLa and PLb increase in width in the Y direction and width in the X direction, the cross-sectional area and diameter in the direction along the XY plane also increase. At the parts where the widths of the pillars PLa and PLb in the Y direction and widths in the X direction are maximum, the cross-sectional area and diameter in the direction along the XY plane are also maximum in each of the pillars PLa and PLb.

Each of the plurality of pillars PL has a memory layer ME penetrating the stacked body LM and extending in the stacking direction, a channel layer CN penetrating the stacked body LM and connected to the intermediate source line BSL, and a core layer CR as the core material of the pillar PL. Among these multilayer structures, the memory layer ME and the channel layer CN also cover the end portion of the pillar PL on the source line SL side. As a result, it can be seen that the pillar PL has a closed end on the source line SL side. In addition, the end portion of the pillar PL on the insulating layer 53 side is an open end where all of these multilayer structures are open.

As illustrated in FIG. 2C, the memory layer ME has a multilayer structure in which a block insulating layer BK, a charge storage layer CT, and a tunnel insulating layer TN are stacked in this order from the outer peripheral side of the pillar PL. More specifically, the memory layer ME is disposed on the side surface of the pillar PL except for the depth position of intermediate source line BSL. In addition, the memory layer ME is also disposed on the upper surface of the pillar PL reaching the height of the source line DSLa. On the other hand, the memory layer ME is not disposed on the lower surface of the pillar PL on the insulating layer 53 side and has a shape open with respect to the insulating layer 53 on the lower surface side of the pillar PL.

Inside the memory layer ME, the channel layer CN reaches the insulating layer 53 from the inside of the source line DSLa by penetrating the intermediate source line BSL, the source line DSLb, the stacked body LM, and the insulating layer 52. In addition, the channel layer CN is also disposed on the upper surface of the pillar PL reaching the height of the source line DSLa. On the other hand, the channel layer CN is not disposed on the lower surface of the pillar PL on the insulating layer 53 side and has a shape open with respect to the insulating layer 53 on the lower surface side of the pillar PL. Further inside, the channel layer CN is filled with the core layer CR.

The core layer CR, like the pillar PL, has a tapered shape in which the width in the Y direction increases, for example, from the upper end portion toward the lower end portion. Alternatively, the core layer CR has, for example, a bow shape in which the width in the Y direction is maximum at a predetermined position between the upper end portion and the lower end portion. In this case, the width in the Y direction increases from the upper end portion of the core layer CR toward the part of the core layer CR with the maximum width in the Y direction. In other words, the core layer CR has different widths depending on its position. For example, the core layer CR has a width Wcr1, which is the width in the Y direction at a fifth position which is at a fifth distance from the top of the core layer CR. The core layer CR has a width Wcr2, which is the width in the Y direction at a sixth position which is at a sixth distance from the top of the core layer CR. The sixth distance is farther from the top of the core layer CR than the fifth distance. The width Wcr1 is smaller than the width Wcr2. The width Wcr1 may be, for example, the width in the Y direction of the core layer CR at the same height as the word line WL located at the top of the stacked body LM. The width Wcr2 may be, for example, the width in the Y direction of the core layer CR at the same height as the word line WL located at the bottom of the laminate LM.

The channel layer CN is in contact with the intermediate source line BSL on the side surface thereof. As a result, the channel layer CN is electrically connected to the source line SL including the intermediate source line BSL. The channel layer CN is connected via a plug CH disposed in the insulating layer 53 to a bit line BL extending in the insulating layer 54 in the direction along the Y direction.

The bit line BL is connected to an electrode pad PDc disposed in the insulating layer 40 via an electrode pad PDb disposed in the insulating layer 54. The electrode pad PDc is electrically connected to the peripheral circuit CBA (see FIG. 1) covered with the insulating layer 40. As a result, the channel layer CN of the pillar PL is electrically connected to the peripheral circuit CBA.

The block insulating layer BK and the tunnel insulating layer TN of the memory layer ME and the core layer CR are, for example, silicon oxide layers. The charge storage layer CT of the memory layer ME is, for example, a silicon nitride layer. The channel layer CN is, for example, a semiconductor layer such as a polysilicon layer and an amorphous silicon layer.

With the configuration described above, each part of the side surface of the pillar PL that faces the word line WL functions as a memory cell. Data writing and reading are performed with respect to the memory cell MC by applying a predetermined voltage from the word line WL.

The stair region SR has a stair portion SP (FIG. 1). The stair portion SP has a stair shape in which the plurality of word lines WL and the plurality of insulating layers OL are processed in a stair shape. FIG. 2B illustrates the part where the third word line WL from the word line WL of the uppermost layer on the source line SL side is processed in a stair shape.

Toward the outside of the stacked body LM in the X direction beyond the cross section of FIG. 2B, the second word line WL from the word line WL of the uppermost layer and the word line WL of the uppermost layer reach the part processed in a stair shape.

Toward the middle portion side of the stacked body LM in the X direction beyond the cross section of FIG. 2B, the fourth and fifth word lines WL from the word line WL of the uppermost layer reach the part processed in a stair shape. Further, the word lines WL of the stacked body LMb of the further lower layers sequentially reach the part processed in a stair shape.

In this manner, the stair portion SP is formed toward the source line SL side with separation from the memory region MR in the middle portion of the stacked body LM. As described above, the insulating layer 51 is disposed between the stair portion SP and the insulating layer 52.

The contact CC penetrating the insulating layers 52 and 51 is connected to the word lines WL that form the respective layers of the stair portion SP.

The contact CC has an insulating layer 56 covering the outer periphery of the contact CC and a conductive layer 22 such as a tungsten layer and a copper layer with which the insulating layer 56 is filled. The conductive layer 22 is connected to the wiring MX disposed in the insulating layer 54 via the plug VO disposed in the insulating layer 53. The wiring MX is electrically connected to the peripheral circuit CBA (see FIG. 1) via, for example, the electrode pads PDb and PDc.

With such a configuration, the word line WL of each layer can be electrically connected. In other words, with the above configuration, it is possible to operate the memory cell MC as a memory element by applying a predetermined voltage from the peripheral circuit CBA to the charge storage layer CT of the memory cell MC via the electrode pads PDc and PDb, the contact CC, and the word line WL.

In addition, a plurality of the columnar portions HR extending in the stacked body LM and the insulating layer 51 in the stacking direction of the stacked body LM are dispersed between the individual plate-shaped contacts LI of the stair region SR. In other words, the columnar portion HR reaches the insulating layer 53 from the inside of the source line DSLa by penetrating the intermediate source line BSL, the source line DSLb, the stacked body LM, and the insulating layer 52.

More specifically, the columnar portion HR includes a columnar portion HRa extending in the stacked body LMa and a columnar portion HRb extending in the stacked body LMb.

The columnar portion HRa reaches the stacked body LMb from the inside of the source line DSLa by penetrating the intermediate source line BSL, the source line DSLb, and the stacked body LMa. The columnar portion HRa has, for example, a tapered shape in which the width in the Y direction increases from the upper end portion toward the lower end portion. Alternatively, the columnar portion HRa has, for example, a bow shape in which the width in the Y direction is maximum at a predetermined position between the upper end portion and the lower end portion. In this case, the width in the Y direction increases toward the part with the maximum width from the upper end portion of the columnar portion HRa to the part with the maximum width in the Y direction. In other word, the columnar portion HRa have different widths depending on its position in the stacking direction. For example, the columnar portion HRa has a width Whr1, which is the width in the Y direction at a seventh position which at a seventh distance from the top of columnar portion HR. The columnar portion HRa has a width Whr2, which is the width in the Y direction at an eighth position which at an eighth distance from the top of columnar portion HR. The eighth distance is farther from the top of the columnar portion HR than the seventh distance. The width Whr1 is smaller than the width Whr2. In FIG. 2B, the width Whr1 is, for example, the width in the Y direction of the columnar portion HRa at the same height as the word line WL located at the top of the stacked body LM.

Therefore, regardless of whether the columnar portion HRa has a tapered shape or a bow shape, the columnar portion HRa has a tapered part directed from one end side of the stacked body LMa close to the source line SL to the other end side of the stacked body LMa close to the stacked body LMb. In addition, regardless of whether the columnar portion HRa has a tapered shape or a bow shape, the columnar portion HRa has the maximum width in the Y direction on the other end side away from the one end portion of the stacked body LMa. In FIG. 2B, the width of columnar portion HRa in the Y direction is described, but the width of columnar portion HRa in the X direction differs along the stacking direction in the same manner.

The columnar portion HRb reaches the insulating layer 53 by penetrating the stacked body LMb (not illustrated) and the insulating layer 52. The columnar portion HRb has, for example, a tapered shape in which the width in the Y direction increases from the upper end portion toward the lower end portion. Alternatively, the columnar portion HRb has, for example, a bow shape in which the width in the Y direction is maximum at a predetermined position between the upper end portion and the lower end portion. In this case, the width in the Y direction increases toward the part with the maximum width from the upper end portion of the columnar portion HRb to the part with the maximum width in the Y direction. In other word, the columnar portion HRb has a width Whr3, which is the width in the Y direction at a ninth position which is at a ninth distance from the top of columnar portion HR. The columnar portion HRb has a width Whr4, which is the width in the Y direction at a tenth position which is at a tenth distance from the top of columnar portion HR. The ninth distance is farther from the top of the columnar portion HR than the eighth distance. The tenth distance is farther from the top of the pillar PL than the ninth distance. The width Whr3 is smaller than the width Whr4. The width Whr2 is larger than the width Whr3. In FIG. 2B, the width Whr4 is, for example, the width in the Y direction of the columnar portion HRb at the same height as the word line WL located at the bottom of the stacked body LM. The width Whr1 is smaller than the width Whr4.

Therefore, regardless of whether the columnar portion HRb has a tapered shape or a bow shape, the columnar portion HRb has a tapered part directed from one end side of the stacked body LMb close to the stacked body LMa to the other end side of the stacked body LMb close to the insulating layer 52. In addition, regardless of whether the columnar portion HRb has a tapered shape or a bow shape, the columnar portion HRb has the maximum width in the Y direction on the other end side of the stacked body LMb. In FIG. 2B, the width of columnar portion HRb in the Y direction is described, but the width of columnar portion HRb in the X direction differs along the stacking direction in the same manner.

In this manner, the part where the plate-shaped contact LI has the maximum width in the Y direction and the parts where the individual columnar portions HRa and HRb have the maximum widths in the Y direction are disposed at different positions in the stacking direction. As a result, among the plurality of columnar portions HR dispersed between the plate-shaped contacts LI, even at the columnar portions HR that are adjacent to the plate-shaped contacts LI, interference such as contact with the plate-shaped contact LI is prevented.

The plurality of columnar portions HR are disposed in, for example, a staggered shape or a grid shape when viewed from the stacking direction of the stacked body LM while avoiding interference with the plate-shaped contact LI and the contact CC. Each columnar portion HR has, for example, a shape such as a circular shape, an elliptical shape, and an oval shape as a cross-sectional shape in the direction along the XY plane.

Therefore, the cross-sectional area and diameter of the columnar portion HR in the direction along the XY plane also change in the stacking direction of the stacked body LM in accordance with the shapes of the columnar portions HRa and HRb. In other words, as the columnar portions HRa and HRb decrease in width in the Y direction and width in the X direction, the cross-sectional area and diameter in the direction along the XY plane also decrease. In addition, as the columnar portions HRa and HRb increase in width in the Y direction and width in the X direction, the cross-sectional area and diameter in the direction along the XY plane also increase. At the parts where the widths of the columnar portions HRa and HRb in the Y direction and widths in the X direction are maximum, the cross-sectional area and diameter in the direction along the XY plane are also maximum in each of the columnar portions HRa and HRb.

Each of the plurality of columnar portions HR has the same layer structure as the pillar PL described above. However, the plurality of columnar portions HR are in a floating state as a whole and are dummy pillars that do not contribute to the function of the semiconductor storage device 1. As will be described later, in forming the stacked body LM from a stacked body in which sacrificial and insulating layers are stacked, the columnar portion HR has the role of supporting these configurations.

As the same layer structure as the pillar PL, the columnar portion HR has dummy layers MEd, CNd, and CRd extending in the stacking direction in the stacked body LM. Among these multilayer structures, the dummy layers MEd and CNd also cover the end portion of the columnar portion HR on the source line SL side. As a result, it can be seen that the columnar portion HR has a closed end on the source line SL side. In addition, the end portion of the columnar portion HR on the insulating layer 53 side is an open end where all of these multilayer structures are open.

As illustrated in FIG. 2D, the dummy layer MEd has a multilayer structure in which dummy layers BKd, CTd, and TNd are stacked in this order from the outer peripheral side of the columnar portion HR. In other words, the dummy layer MEd corresponds to the memory layer ME of the pillar PL described above. In addition, the dummy layers BKd, CTd, and TNd of the dummy layer MEd correspond to the block insulating layer BK, the charge storage layer CT, and the tunnel insulating layer TN of the pillar PL, respectively.

It is noted that the dummy layer MEd is continuously disposed on the side surface of the columnar portion HR reaching the source line DSLa from the source line DSLb. In addition, the dummy layer MEd is also disposed on the upper surface of the columnar portion HR reaching the height of the source line DSLa. On the other hand, the dummy layer MEd is not disposed on the lower surface of the columnar portion HR on the insulating layer 53 side and has a shape open with respect to the insulating layer 53 on the lower surface side of the columnar portion HR.

Inside the dummy layer MEd, the dummy layer CNd reaches the insulating layer 53 from the inside of the source line DSLa by penetrating the intermediate source line BSL, the source line DSLb, the stacked body LM, and the insulating layer 52. In other words, the dummy layer CNd corresponds to the channel layer CN of the pillar PL described above.

In addition, the dummy layer CNd is also disposed on the upper surface of the columnar portion HR reaching the height of the source line DSLa. On the other hand, the dummy layer CNd is not disposed on the lower surface of the columnar portion HR on the insulating layer 53 side and has a shape open with respect to the insulating layer 53 on the lower surface side of the columnar portion HR.

Further inside, the dummy layer CNd is filled with the dummy layer CRd as the core material of the columnar portion HR. In other words, the dummy layer CRd corresponds to the core layer CR of the pillar PL described above. The width Wcrd1 of the dummy layer CRd corresponds to the width Wcr1 of the core layer CR. The width Wcrd2 of the dummy layer CRd corresponds to the width Wcr2 of the core layer CR.

The respective layers of the columnar portion HR include the same materials as the respective layers of the pillar PL that correspond. In other words, the dummy layers BKd and TNd of the dummy layer MEd and the dummy layer CRd are, for example, silicon oxide layers. The dummy layer CTd is, for example, a silicon nitride layer. The dummy layer CNd is, for example, a semiconductor layer such as a polysilicon layer and an amorphous silicon layer.

It should be noted that at the same height position of the stacked body LM, the cross-sectional area of the columnar portion HR in the direction along the XY plane may be larger than, for example, the cross-sectional area of the pillar PL in the direction along the XY plane. In addition, the pitch between the plurality of columnar portions HR may be larger than, for example, the pitch between the plurality of pillars PL. In the XY plane, the density of the columnar portions HR per unit area of the word lines WL in the stacked body LM may be lower than the density of the pillars PL per unit area of the word lines WL.

By, for example, configuring the pillar PL to be smaller in cross-sectional area than the columnar portion HR and narrowing the pitch as described above, a large number of memory cells MC can be densely formed in the stacked body LM that has a predetermined size and the storage capacity of the semiconductor storage device 1 can be increased. Meanwhile, the columnar portion HR is exclusively used in order to support the stacked body LM, and thus manufacturing complexity can be reduced by not requiring a precise configuration with a small cross-sectional area and a narrow pitch, as with the pillar PL.

(Semiconductor Storage Device Manufacturing Method)

Next, a method for manufacturing the semiconductor storage device 1 according to the embodiment will be described with reference to FIGS. 3A to 16B. FIGS. 3A to 16B are diagrams partially and sequentially illustrating a procedure of the method for manufacturing the semiconductor storage device 1 according to the embodiment. It should be noted that in the description of the method for manufacturing the semiconductor storage device 1, the direction in which the treatment surface in each process is directed is the upper side. In each of FIGS. 3A to 16B as well, the direction of the semiconductor storage device 1 in each process and the direction of the paper surface are matched.

Figure 3A:
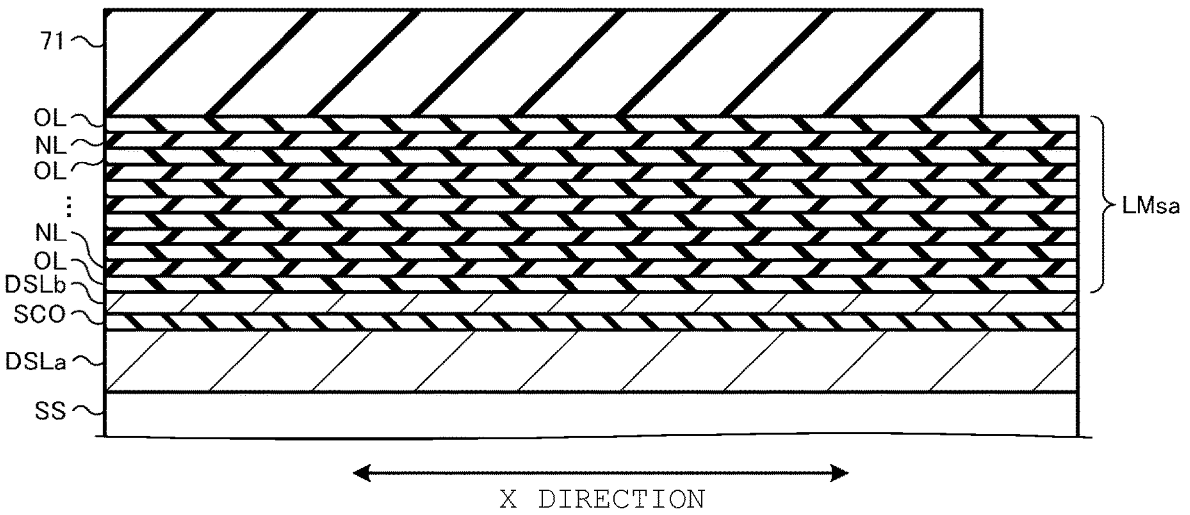
FIGS. 3A to 3C are diagrams partially and sequentially illustrating a procedure in a semiconductor storage device manufacturing method according to the embodiment.
Figure 3B:
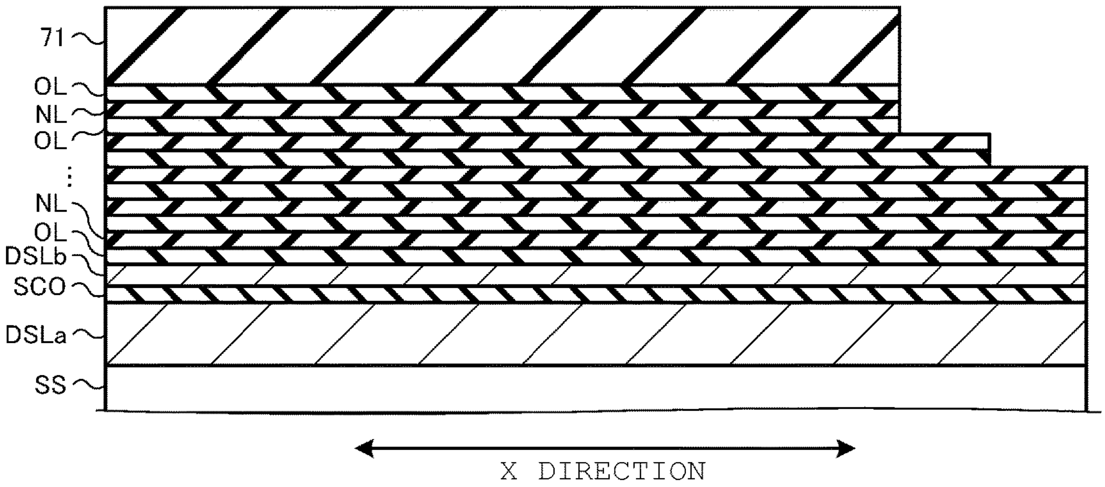
Figure 3C:
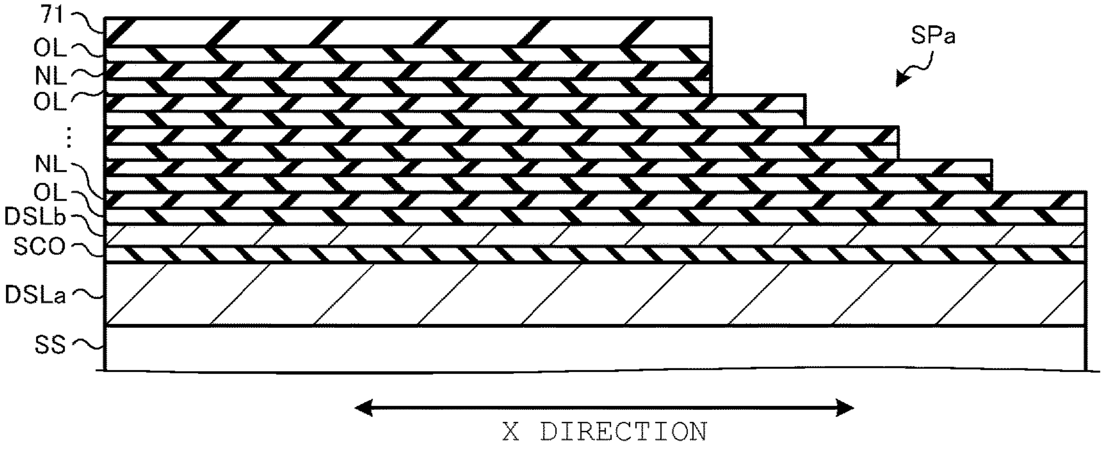

First, FIGS. 3A to 3C illustrate how to form a part SPa, which will later become a part of the stair portion SP. FIGS. 3A to 3C illustrate cross sections along the X direction of the stair region SR that is in the process of manufacturing.

As illustrated in FIG. 3A, the source line DSLa, the intermediate insulating layer SCO, and the source line DSLb are formed in this order above a supporting substrate SS. The supporting substrate SS may be, for example, a semiconductor substrate such as a silicon substrate, an insulating substrate such as a ceramic substrate or a quartz substrate, or a conductive substrate such as a sapphire substrate. The source lines DSLa and DSLb are, for example, polysilicon layers. The intermediate insulating layer SCO is a silicon oxide layer or the like.

Formed on the source line DSLb is a stacked body LMsa in which insulating layers NL and the insulating layers OL are alternately stacked layer by layer. The insulating layer NL, which is a silicon nitride layer or the like, functions as a sacrificial layer to be replaced with a conductive material that will later become the word line WL. The stacked body LMsa is a part that will later become the stacked body LMa by such replacement treatment.

A mask pattern 71, which covers a part of the stacked body LMsa, is formed on the stacked body LMsa. The mask pattern 71 is formed by, for example, exposing and developing a photoresist layer or the like.

As illustrated in FIGS. 3B and 3C, the thinning of the mask pattern 71 and the etching of the insulating layer NL and the insulating layer OL of the stacked body LMsa are repeated a plurality of times.

In other words, the mask pattern 71 having an end portion at the position where the stair portion SP is to be formed, is formed. In addition, the stacked body LMsa exposed from the mask pattern 71 is processed and, for example, the insulating layer NL and the insulating layer OL are removed by etching layer by layer. In addition, treatment with oxygen plasma or the like is performed to retract the end portion of the mask pattern 71 and newly expose the stacked body LMsa, and the insulating layer NL and the insulating layer OL are further removed by etching layer by layer.

By repeating such treatment a plurality of times, the insulating layer NL and the insulating layer OL are processed in a stair shape at the end portion position of the mask pattern 71 to form the part SPa, which will later become a part of the stair portion SP. After a stair shape is formed over the entire stacking direction of the stacked body LMsa, the mask pattern 71 is removed by ashing using oxygen plasma or the like.

Figure 4A:
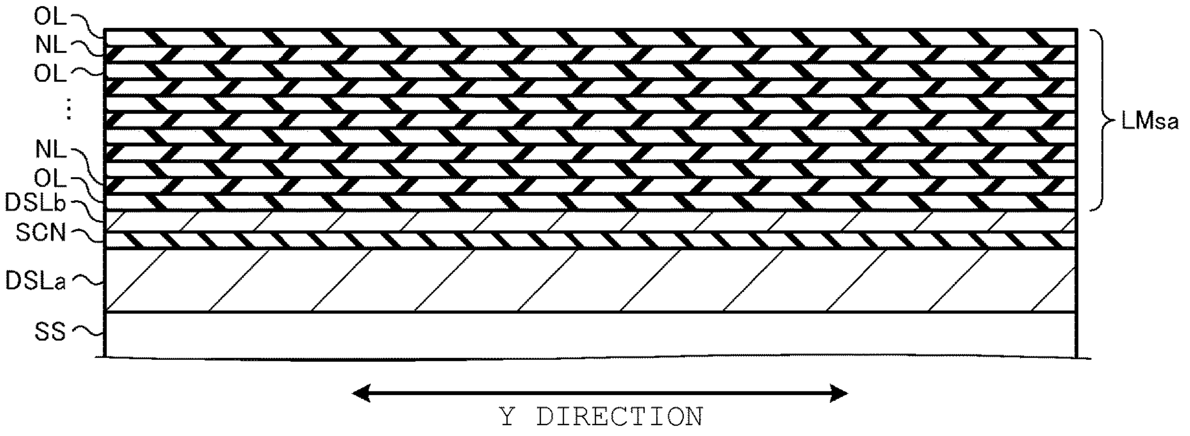
FIGS. 4A to 4C are diagrams partially and sequentially illustrating a procedure in the semiconductor storage device manufacturing method according to the embodiment.
Figure 4B:
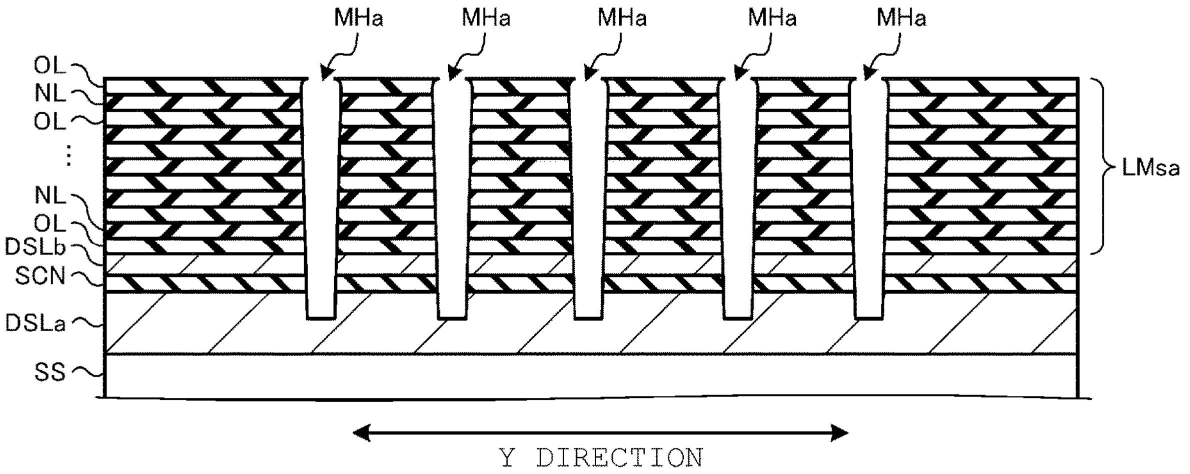
Figure 4C:
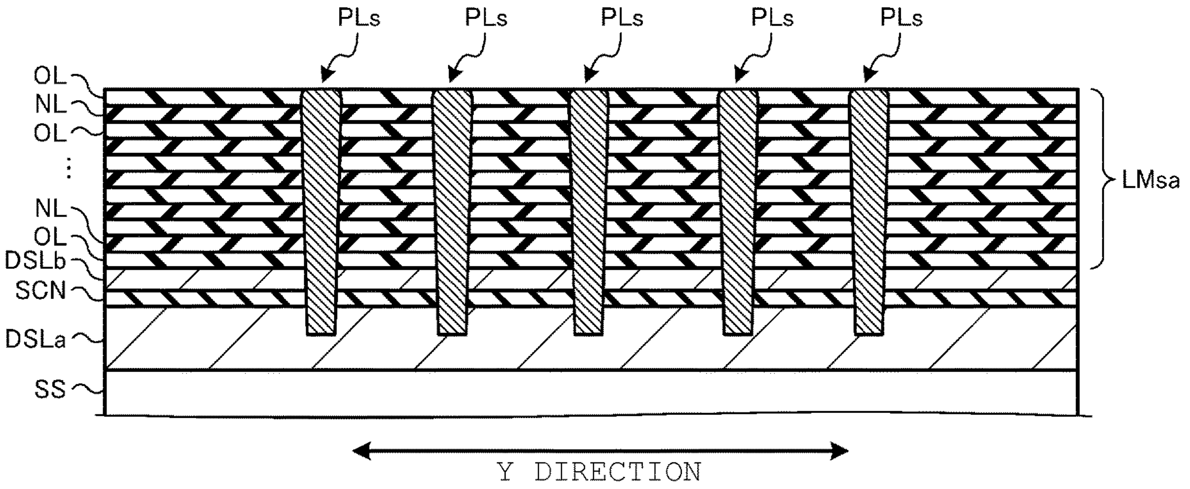

Next, FIGS. 4A to 4C illustrate how to form a configuration that will later become the pillar PLa. FIGS. 4A to 4C illustrate cross sections along the Y direction of the memory region MR that is in the process of manufacturing.

In parallel with the formation of the source line DSLa, the intermediate insulating layer SCO, the source line DSLb, and the stacked body LMsa in the stair region SR of FIG. 3A, as illustrated in FIG. 4A, in the memory region MR, the source line DSLa, an intermediate sacrificial layer SCN, the source line DSLb, and the stacked body LMsa are formed in this order above the supporting substrate SS. The intermediate sacrificial layer SCN, which is a silicon nitride layer or the like, is a part that will later become the intermediate source line BSL by being replaced with conductive polysilicon or the like.

As illustrated in FIG. 4B, a plurality of memory holes MHa are formed that reach the source line DSLa from the upper surface of the stacked body LMsa by etching, such that the stacked body LMsa, the source line DSLb, and the intermediate sacrificial layer SCN are penetrated. The upper surface of the stacked body LMsa is the end portion of the stacked body LMsa on the side opposite to the source line DSLa, the intermediate sacrificial layer SCN, and the source line DSLb in the stacking direction of the stacked body LMsa.

The plurality of memory holes MHa are formed so as to have, for example, a tapered shape in which the width in the Y direction, the diameter of the memory hole MHa, and the area of the XY cross section of the memory hole MHa decrease from the upper surface side toward the lower surface side of the stacked body LMsa.

The plurality of memory holes MHa may have a bow shape to have the maximum width in the Y direction between the end portion on the upper surface side and the end portion on the lower surface side of the stacked body LMsa. In this case, the plurality of memory holes MHa are formed such that the width in the Y direction, the diameter of the memory hole MHa, and the area of the XY cross section of the memory hole MHa decrease toward the lower end portion from the part with the maximum width in the Y direction.

As illustrated in FIG. 4C, the memory holes MHa are filled with sacrificial layers such as amorphous silicon layers to form a plurality of pillars PLs.

Figure 5A:
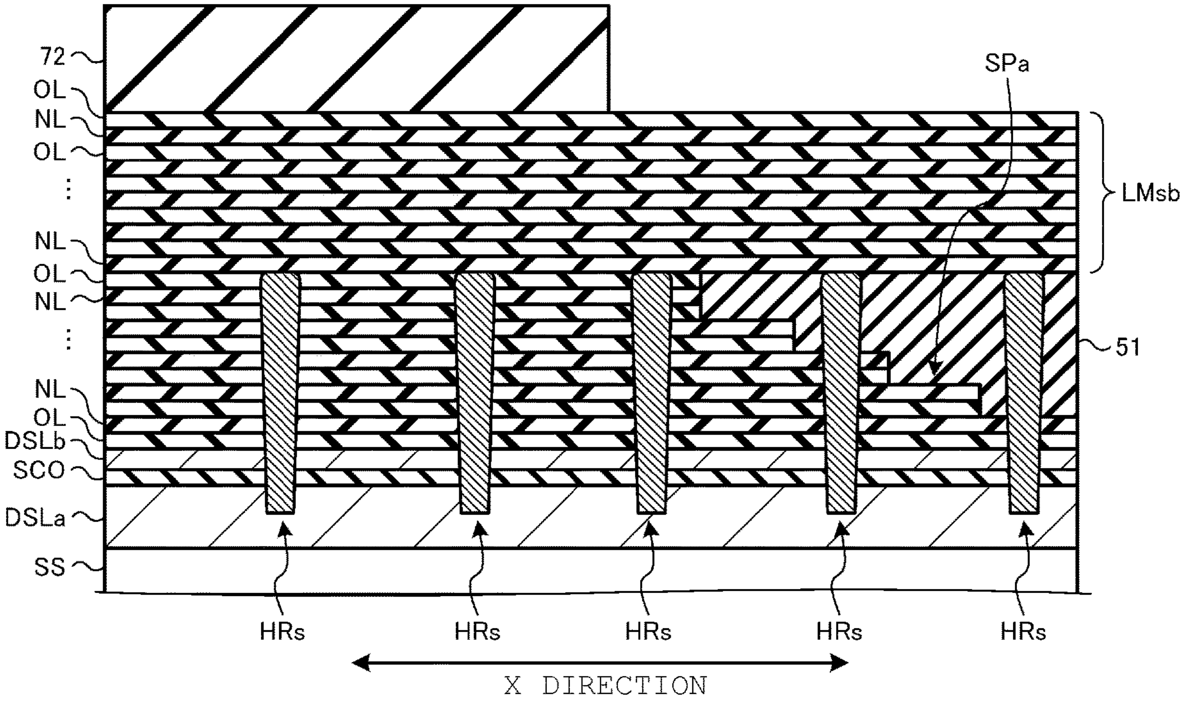
FIGS. 5A and 5B are diagrams partially and sequentially illustrating a procedure in the semiconductor storage device manufacturing method according to the embodiment.
Figure 5B:
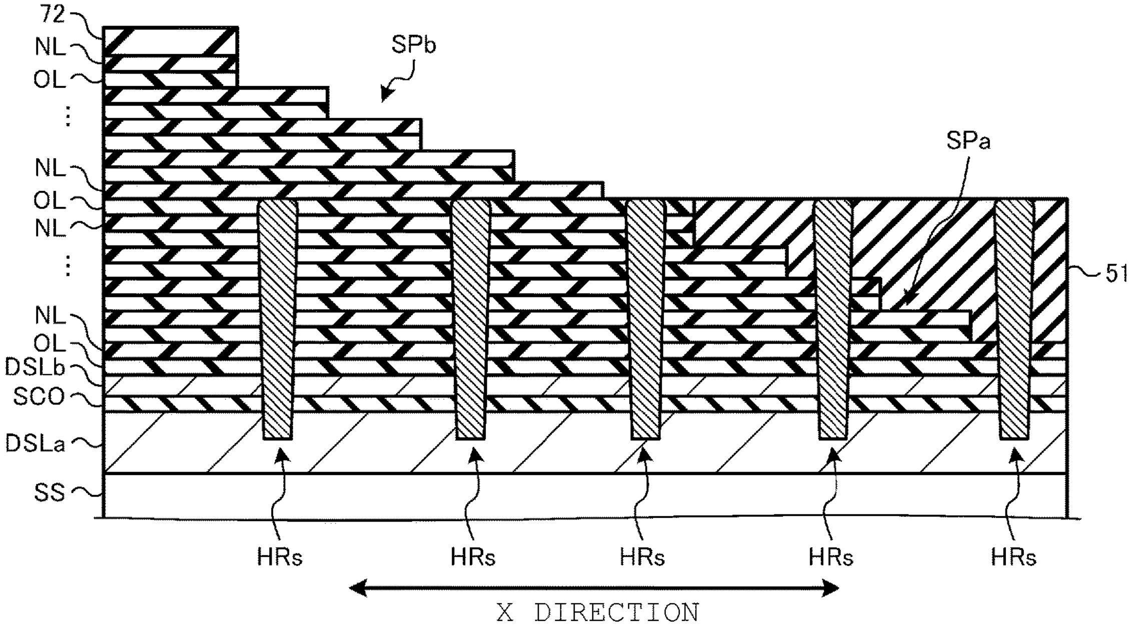

Next, FIGS. 5A and 5B illustrate how to form a part SPb, which is the remaining part of the stair portion SP. FIGS. 5A and 5B as well as FIGS. 3A to 3C described above illustrate cross sections along the X direction of the stair region SR that is in the process of manufacturing.

As illustrated in FIG. 5A, after forming the part SPa, which will later become a part of the stair portion SP, the insulating layer 51 covering the stair shape is formed in the stair region SR.

In addition, in parallel with the formation of the pillars PLs in the memory region MR of FIGS. 4A to 4C, a plurality of columnar portions HRs are formed in the stacked body LMsa of the stair region SR. The columnar portion HRs is a part that will later become the columnar portion HRa.

On the stacked body LMsa where the columnar portions HRs are formed, a stacked body LMsb is formed in which the insulating layers NL and the insulating layers OL are alternately stacked layer by layer. The stacked body LMsb is a part that will later become the stacked body LMb.

A mask pattern 72, which covers a part of the stacked body LMsb, is formed on the stacked body LMsb. The mask pattern 72 is formed by, for example, exposing and developing a photoresist layer or the like. The mask pattern 72 has an end portion at a position overlapping the part SPb, which is a part of the stair portion SP formed in the stacked body LMsb, in the stacking direction.

As illustrated in FIG. 5B, the thinning of the mask pattern 72 and the etching of the insulating layer NL and the insulating layer OL of the stacked body LMsb are repeated a plurality of times similarly to the treatment of FIGS. 3B and 3C described above. As a result, the insulating layer NL and the insulating layer OL are processed in a stair shape at the end portion position of the mask pattern 72. After a stair shape is formed over the entire stacking direction of the stacked body LMsb, the mask pattern 72 is removed by ashing using oxygen plasma or the like.

Next, FIGS. 6A to 7B illustrate how to form the pillars PL. FIGS. 6A to 7B as well as FIGS. 4A to 4C described above illustrate a cross section along the Y direction of the memory region MR that is in the process of manufacturing.

Figure 6A:
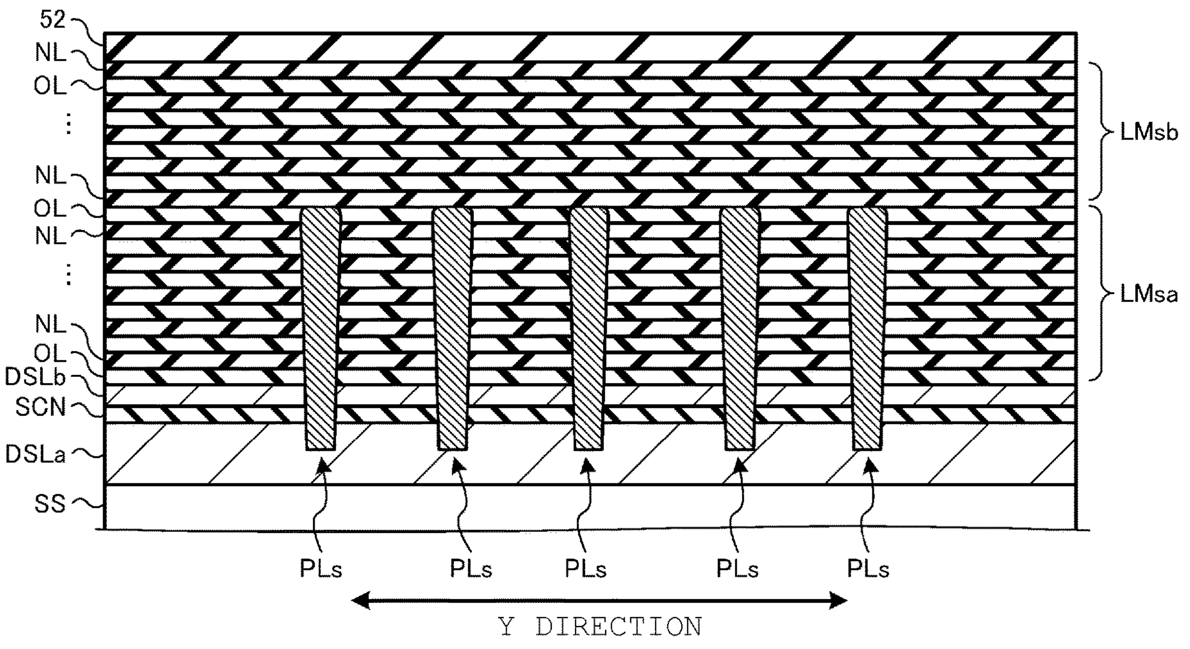
FIGS. 6A and 6B are diagrams partially and sequentially illustrating a procedure in the semiconductor storage device manufacturing method according to the embodiment.

In parallel with the formation of the stacked body LMsb in the stair region SR of FIG. 5A, the stacked body LMsb is also formed on the stacked body LMsa of the memory region MR as illustrated in FIG. 6A. In addition, the insulating layer 52 covering the stacked body LMsb is formed on the stacked body LMsb.

Figure 6B:
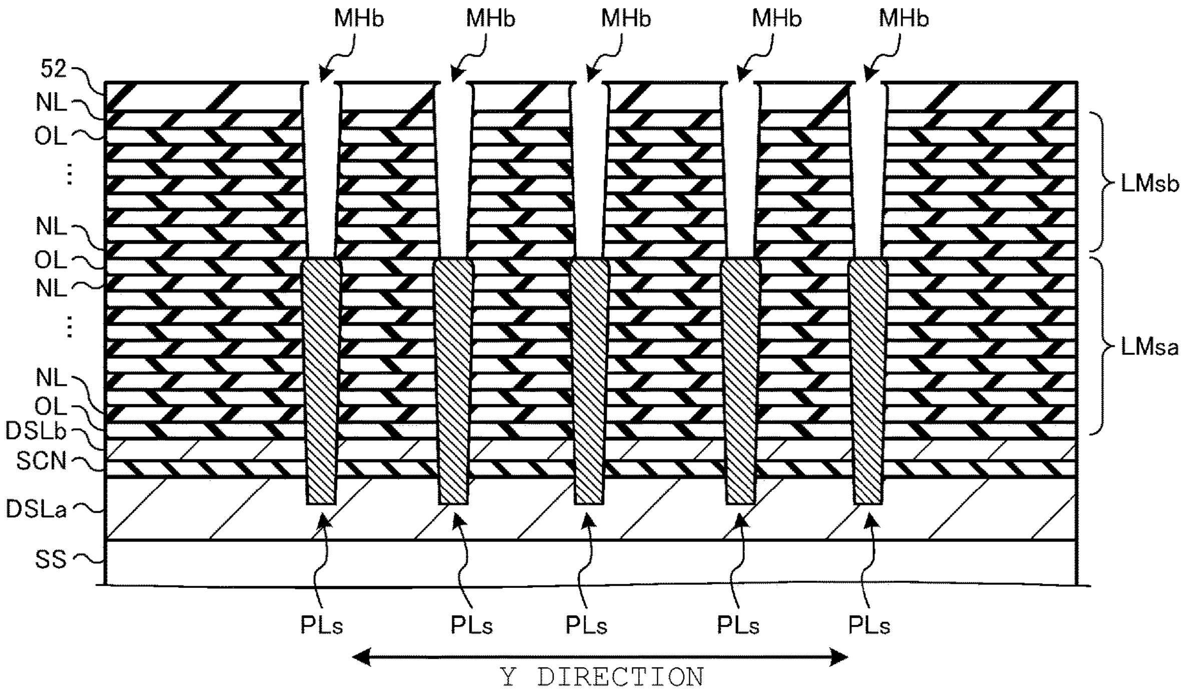

As illustrated in FIG. 6B, a plurality of memory holes MHb are formed that respectively reach the pillars PLs formed in the stacked body LMsa by etching, such that the insulating layer 52 and the stacked body LMsb from the upper surface of the stacked body LMsb are penetrated, that is, the end portion of the stacked body LMsb on the side opposite to the stacked body LMsa.

The plurality of memory holes MHb have, for example, a tapered shape in which the width in the Y direction, the diameter of the memory hole MHb, and the area of the XY cross section of the memory hole MHb decrease from the upper surface side toward the lower surface side of the stacked body LMsb.

The plurality of memory holes MHb may have a bow shape to have the maximum width in the Y direction between the end portion on the upper surface side and the end portion on the lower surface side of the stacked body LMsa. In this case, the plurality of memory holes MHb are formed such that the width in the Y direction, the diameter of the memory hole MHb, and the area of the XY cross section of the memory hole MHb decrease toward the lower end portion from the part with the maximum width in the Y direction.

Figure 7A:
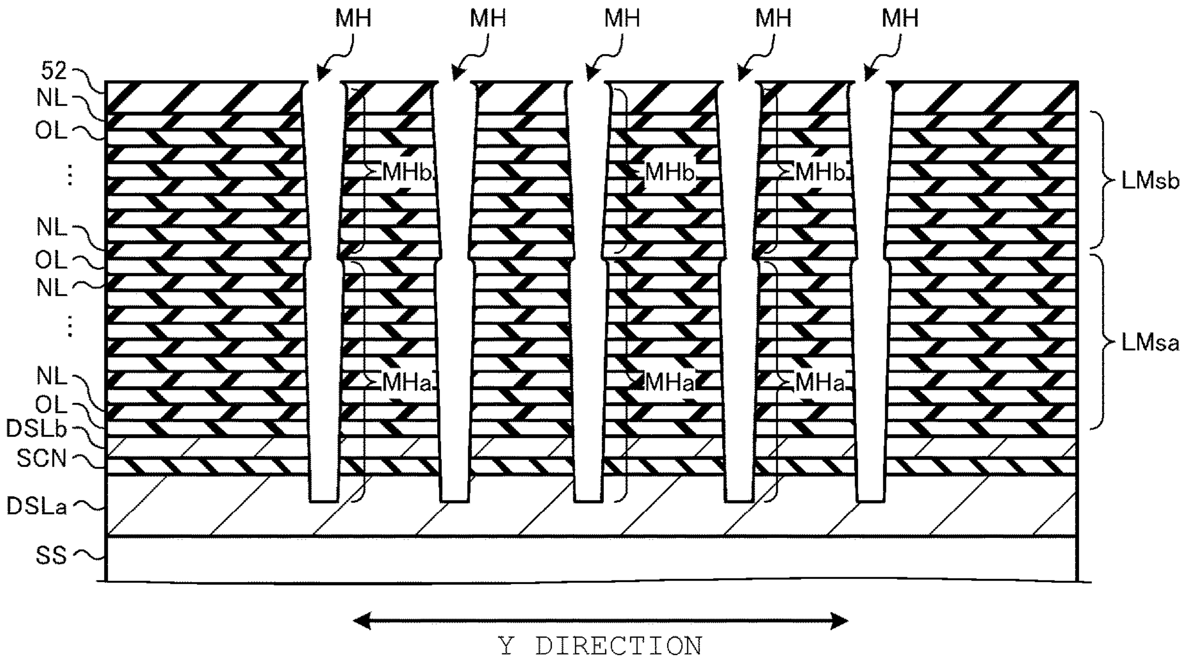
FIGS. 7A and 7B are diagrams partially and sequentially illustrating a procedure in the semiconductor storage device manufacturing method according to the embodiment.

As illustrated in FIG. 7A, the sacrificial layer with which the memory hole MHa is filled is removed via the memory hole MHb. Formed as a result are a plurality of memory holes MH, which reach the source line DSLa by etching, such that the insulating layer 52, the stacked bodies LMsb and LMsa, the source line DSLb, and the intermediate sacrificial layer SCN are penetrated.

Figure 7B:
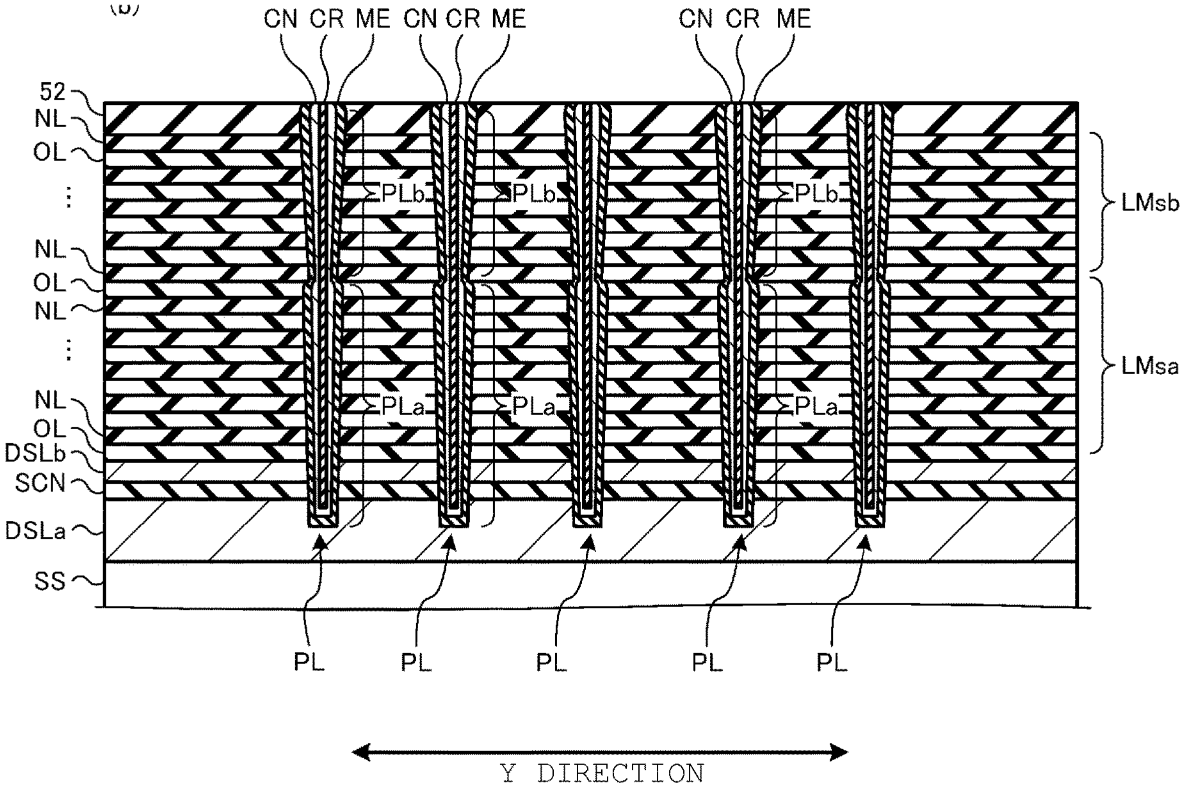

As illustrated in FIG. 7B, the memory layers ME are formed in the memory holes MH. In the memory layer ME, the block insulating layer BK (not illustrated), the charge storage layer CT (not illustrated), and the tunnel insulating layer TN (not illustrated) are stacked in this order from the outer peripheral side of the memory hole MH. The memory layer ME is also formed on the bottom surface of the memory hole MH. As described above, the block insulating layer BK and the tunnel insulating layer TN are, for example, silicon oxide layers, and the charge storage layer CT is, for example, a silicon nitride layer.

In addition, the channel layer CN such as a polysilicon layer and an amorphous silicon layer is formed inside the memory layer ME. The channel layer CN is also formed on the bottom surface of the memory hole MH via the memory layer ME. In addition, further inside, the channel layer CN is filled with the core layer CR such as a silicon oxide layer.

The plurality of pillars PL are formed as a result of the above. It is noted that, in this stage, the memory layer ME is also formed at the height position of the intermediate sacrificial layer SCN and covers the entire side surface of the channel layer CN.

As described above, the plurality of pillars PL individually including the pillars PLa and PLb are formed by processing, for example, the stacked bodies LMsa and LMsb from the upper surface sides of the stacked bodies LMsa and LMsb. In addition, the lower end portions of the plurality of pillars PL are closed ends with bottom surfaces covered with the memory layer ME and the channel layer CN. In addition, the upper end portions of the plurality of pillars PL are open ends where both the memory layer ME and the channel layer CN are open.

Since the plurality of pillars PL have closed ends on one end side in the stacking direction of the stacked bodies LMsa and LMsb and open ends on the other end side, it can be seen from which side of the upper and lower surfaces of the stacked bodies LMsa and LMsb the processing has been performed. In other words, the pillar PL is processed from the side with an open end toward the side with a closed end.

Next, FIGS. 8A to 9B illustrate how to form the contact CC in the stair shape to become the stair portion SP. FIGS. 8A to 9B as well as FIGS. 3A to 5B described above illustrate a cross section along the X direction of the stair region SR that is in the process of manufacturing.

Figure 8A:
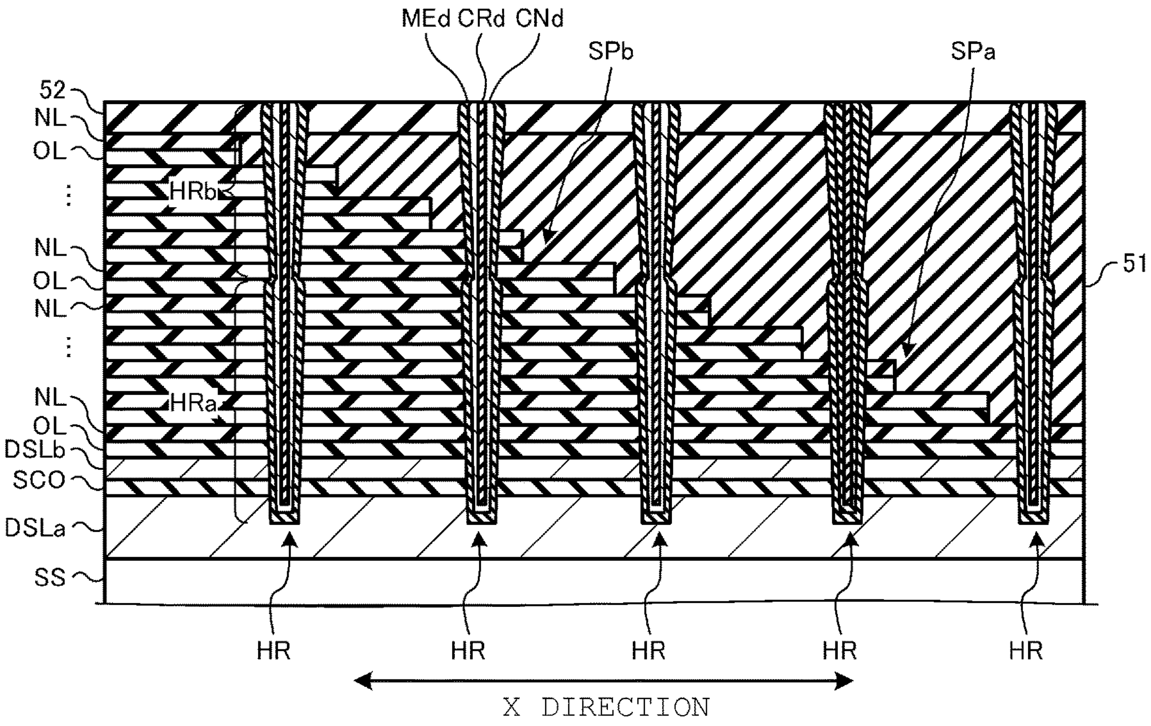
FIGS. 8A and 8B are diagrams partially and sequentially illustrating a procedure in the semiconductor storage device manufacturing method according to the embodiment.

As illustrated in FIG. 8A, after forming the part SPb, which will later become the remaining part of the stair portion SP, the insulating layer 51 covering the entire stair shape is formed in the stair region SR. The insulating layer 52 is formed on the insulating layer 51 as in the case of the memory region MR.

In addition, in parallel with the formation of the pillar PL in the memory region MR of FIGS. 6A to 7B, the plurality of columnar portions HR are formed in the stacked bodies LMsa and LMbs of the stair region SR.

As in the case of the pillars PL, the plurality of columnar portions HR individually including the columnar portions HRa and HRb are also formed by processing, for example, the stacked bodies LMsa and LMsb from the upper surface sides of the stacked bodies LMsa and LMsb. In addition, the lower end portions of the plurality of columnar portions HR are closed ends with bottom surfaces covered with the dummy layers MEd and CNd. In addition, the upper end portions of the plurality of columnar portions HR are open ends where both the dummy layers MEd and CNd are open. From this, it can be seen that the columnar portion HR is processed from the side with an open end toward the side with a closed end.

Figure 8B:
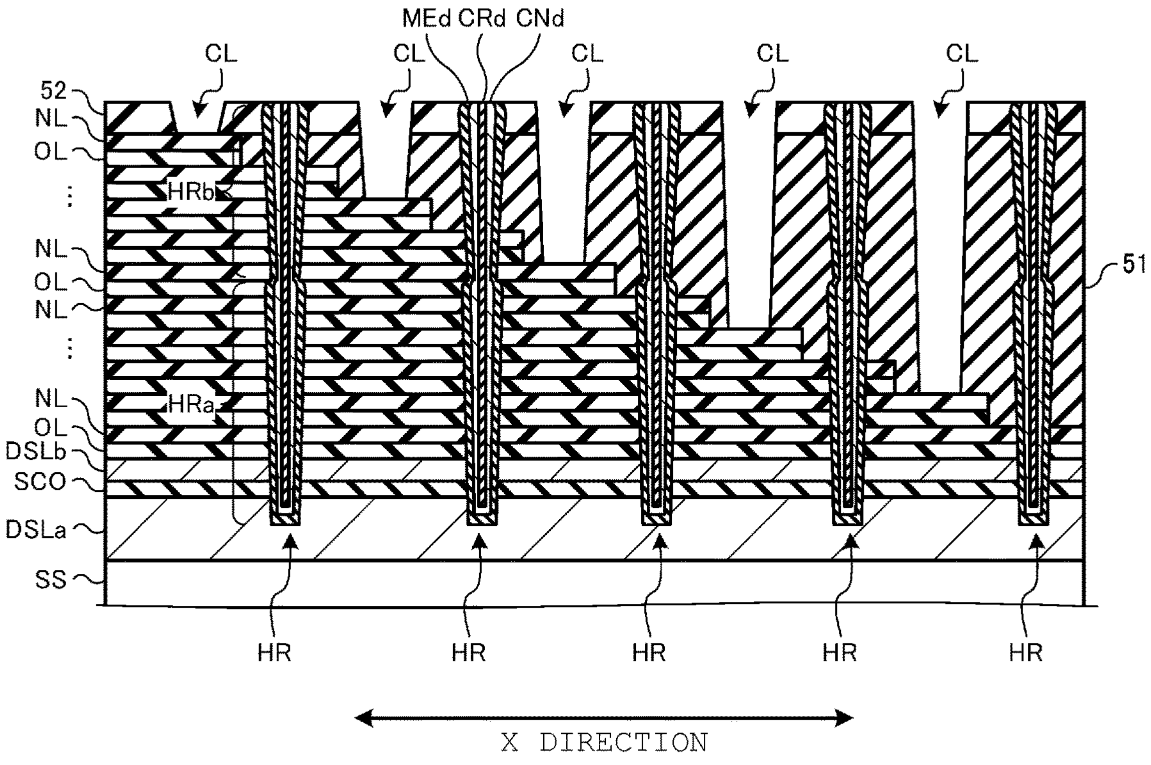

As illustrated in FIG. 8B, a plurality of contact holes CL are formed to penetrate the insulating layers 52 and 51 and reach the upper surfaces of the individual insulating layers NL processed in a stair shape. In FIG. 8B, the contact holes CL formed in every other insulating layer NL are illustrated in order to illustrate both the columnar portion HR and the contact hole CL formed in the stair region SR. However, the contact holes CL are actually formed to correspond to every insulating layer NL.

Figure 9A:
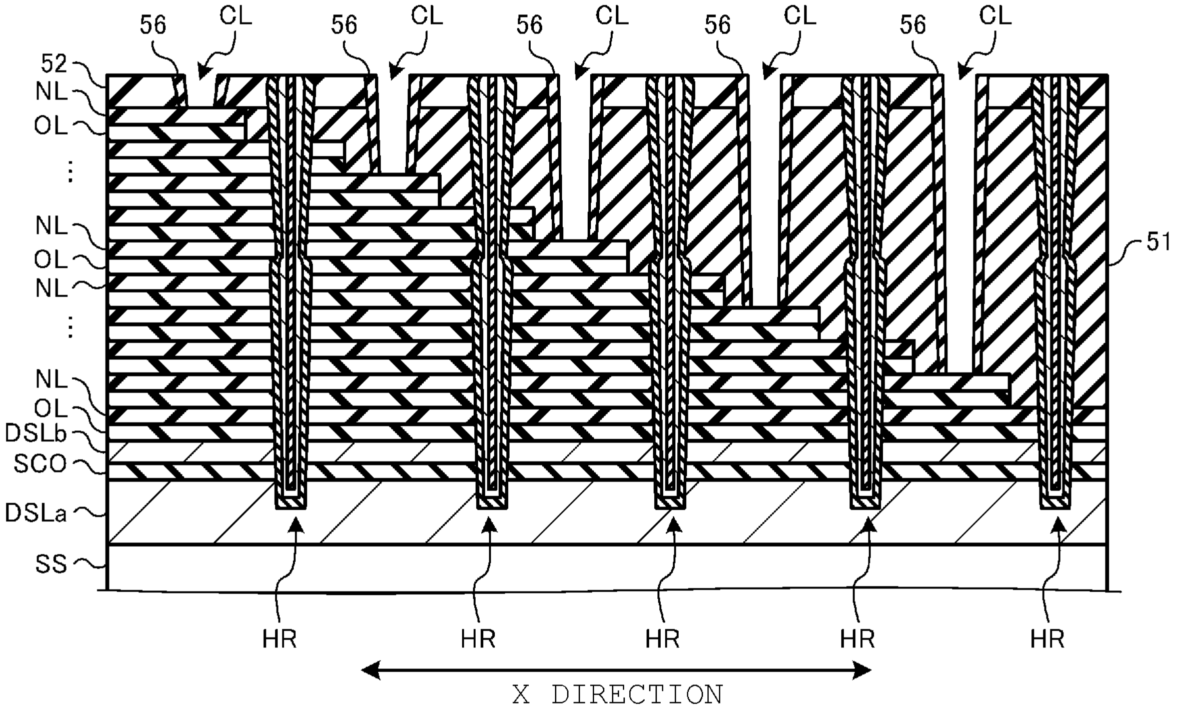
FIGS. 9A and 9B are diagrams partially and sequentially illustrating a procedure in the semiconductor storage device manufacturing method according to the embodiment.

As illustrated in FIG. 9A, the insulating layer 56 is formed to cover the side wall of the contact hole CL.

Figure 9B:
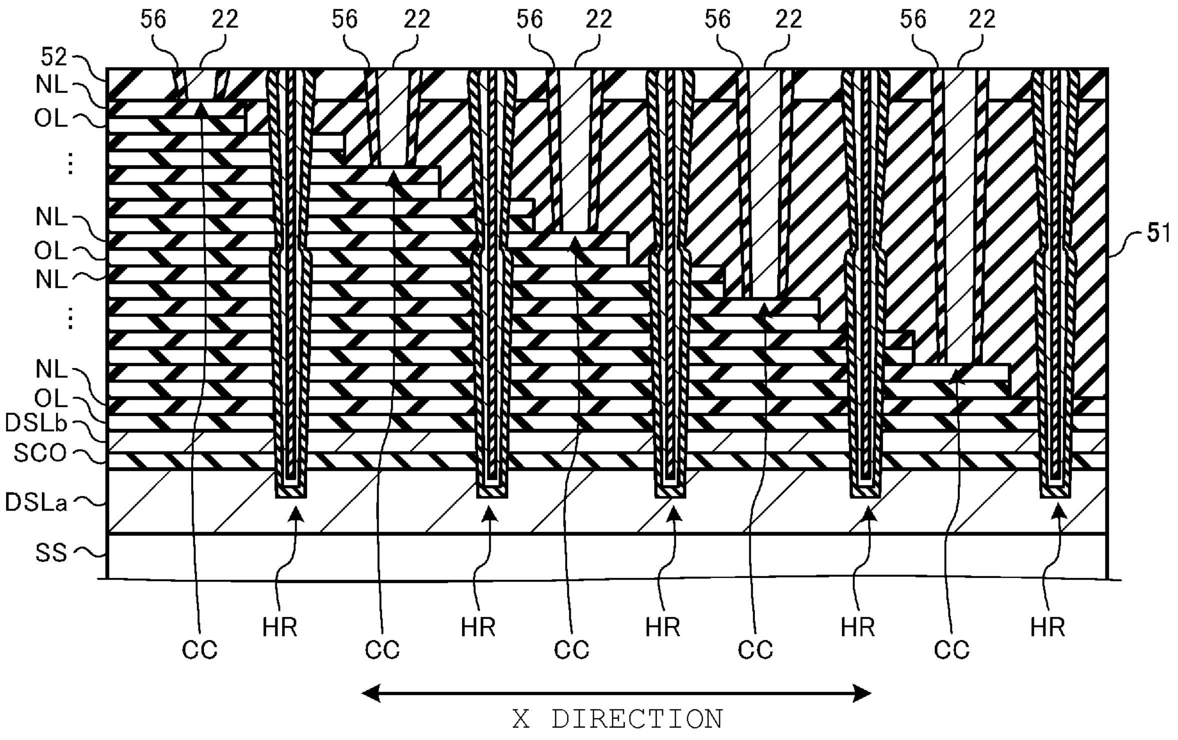

As illustrated in FIG. 9B, the conductive layer 22 is formed further inside of the insulating layer 56 on the side wall of the contact hole CL to be filled. As a result of the above, the plurality of contacts CC respectively connected to the plurality of insulating layers NL are formed.

Next, FIGS. 10A to 12 illustrate how to form the peripheral circuit CBA on the stacked bodies LMa and LMb. FIGS. 10A to 12 as well as FIGS. 4A to 4C, 6A and 6B, and 7A and 7B described above illustrate a cross section along the Y direction of the memory region MR that is in the process of manufacturing.

Figure 10A:
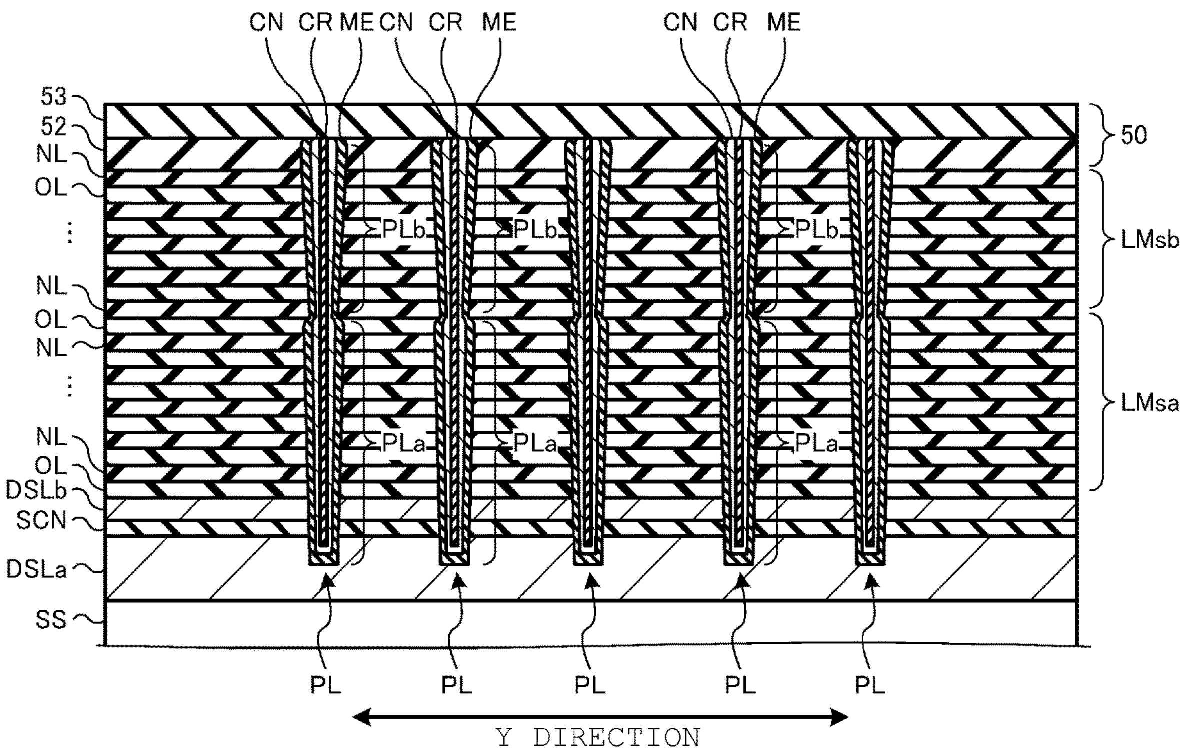
FIGS. 10A and 10B are diagrams partially and sequentially illustrating a procedure in the semiconductor storage device manufacturing method according to the embodiment.

As illustrated in FIG. 10A, in forming the peripheral circuit CBA, the insulating layer 53 is formed to cover the insulating layer 52 on the stacked bodies LMa and LMb.

Figure 10B:
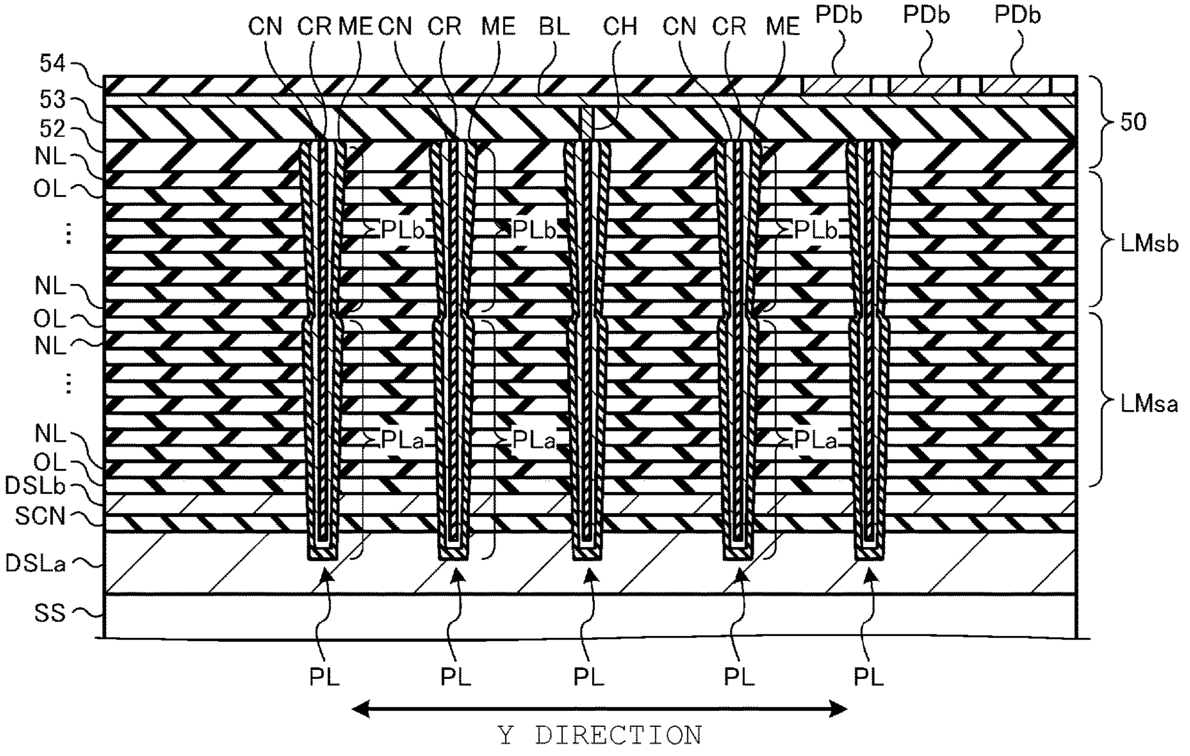

As illustrated in FIG. 10B, the plug CH is formed that penetrates the insulating layer 53 and is connected to the channel layer CN of the pillar PL. In addition, the bit line BL connected to the plug CH is formed on the insulating layer 53. In addition, the insulating layer 54 covering the insulating layer 53 and the bit line BL is formed, and the plurality of electrode pads PDb exposed on the upper surface of the insulating layer 54 are formed in the insulating layer 54.

In addition, in the stair region SR, the plug VO disposed in the insulating layer 53, the wiring MX disposed in the insulating layer 54 and connected to the plug VO, and so on are formed in parallel with the above treatment (see FIGS. 2A to 2D). The plugs VO are formed at positions respectively corresponding to the plurality of contacts CC and are connected to the contacts CC. In addition, the plug VO is also formed at a position where the plate-shaped contact LI is to be formed later.

Figure 11:
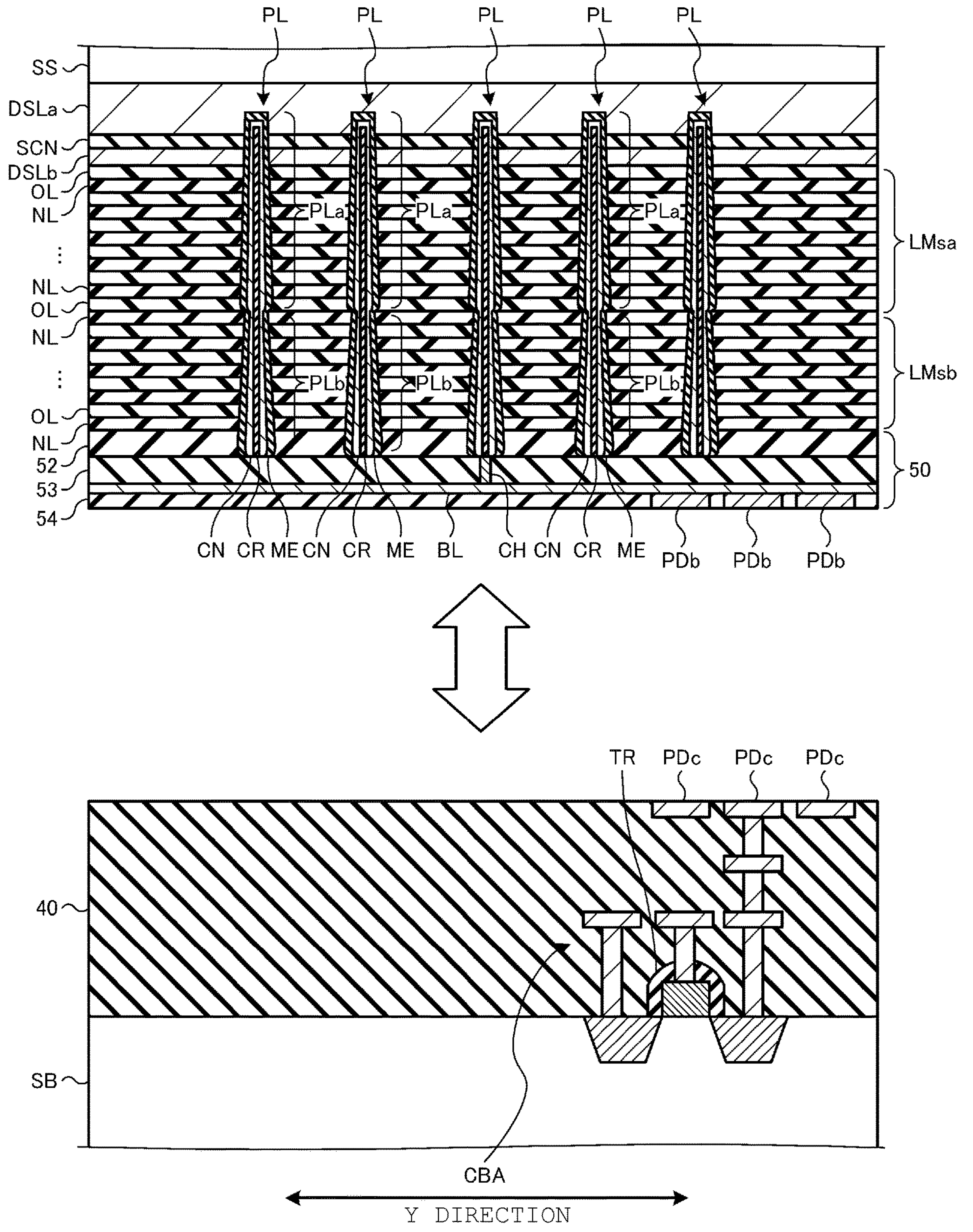
FIG. 11 is a diagram partially and sequentially illustrating a procedure in the semiconductor storage device manufacturing method according to the embodiment.

As illustrated in FIG. 11, the peripheral circuit CBA including the transistor TR is separately formed on the semiconductor substrate SB. In addition, the insulating layer 40 covering the peripheral circuit CBA is formed on the semiconductor substrate SB. In the insulating layer 40, a contact, a via, wiring, and so on connected to the peripheral circuit CBA are formed. In addition, the plurality of electrode pads PDc exposed on the surface of the insulating layer 40 are formed in the insulating layer 40. Via these configurations, a memory cell can be electrically connected to the peripheral circuit CBA.

In addition, the surface of the supporting substrate SS on which the stacked bodies LMsa and LMb and so on are formed faces the semiconductor substrate SB with the peripheral circuit CBA, the insulating layer 40, the plurality of electrode pads PDc, and so on formed.

In addition, the insulating layer 54 on the supporting substrate SS side and the insulating layer 40 on the semiconductor substrate SB side are bonded. These insulating layers 54 and 40 can be bonded by, for example, being pre-activated by plasma treatment or the like. In addition, in bonding the insulating layers 54 and 40, the supporting substrate SS and the semiconductor substrate SB are aligned such that the electrode pad PDb formed in the insulating layer 54 and the electrode pad PDc formed in the insulating layer 40 overlap.

After bonding the insulating layers 54 and 40, annealing is performed and the electrode pads PDb and PDc are bonded by, for example, Cu—Cu bonding. A bonded structure is obtained as a result.

Figure 12:
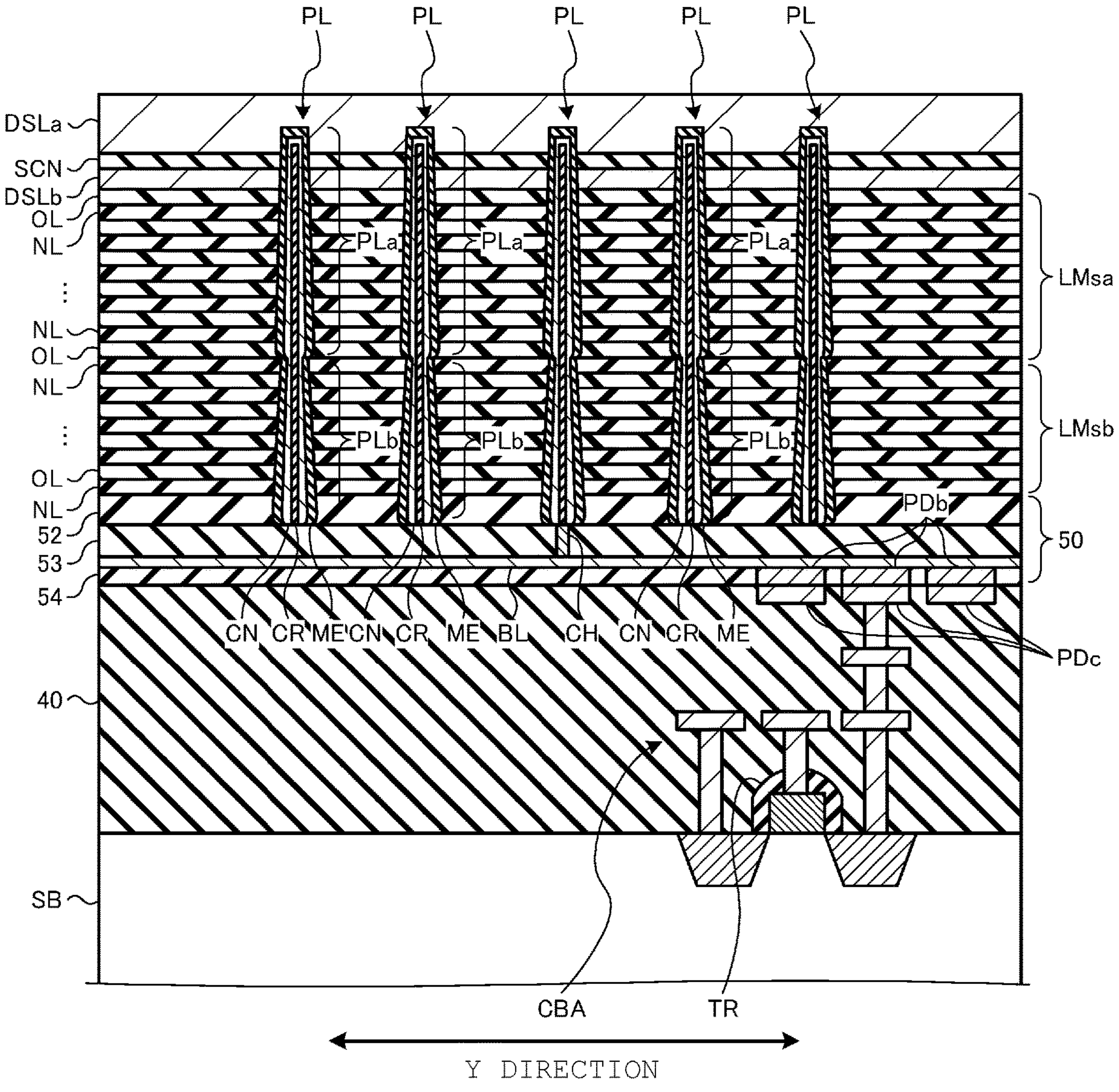
FIG. 12 is a diagram partially and sequentially illustrating a procedure in the semiconductor storage device manufacturing method according to the embodiment.

Subsequently, as illustrated in FIG. 12, the supporting substrate SS is removed from the bonded structure by chemical mechanical polishing (CMP) or the like to expose the source line DSLa. Subsequently, various treatments are performed with the newly exposed source line DSLa side as an upper surface.

Next, FIGS. 13A to 14B illustrate how to form the source line SL. FIGS. 13A to 14B illustrate a cross section along the Y direction of the memory region MR that is in the process of manufacturing. It should be noted that in the subsequent drawings including FIGS. 13A to 14B, the structures below the insulating layer 40 including the semiconductor substrate SB and the peripheral circuit CBA are omitted.

Figure 13A:
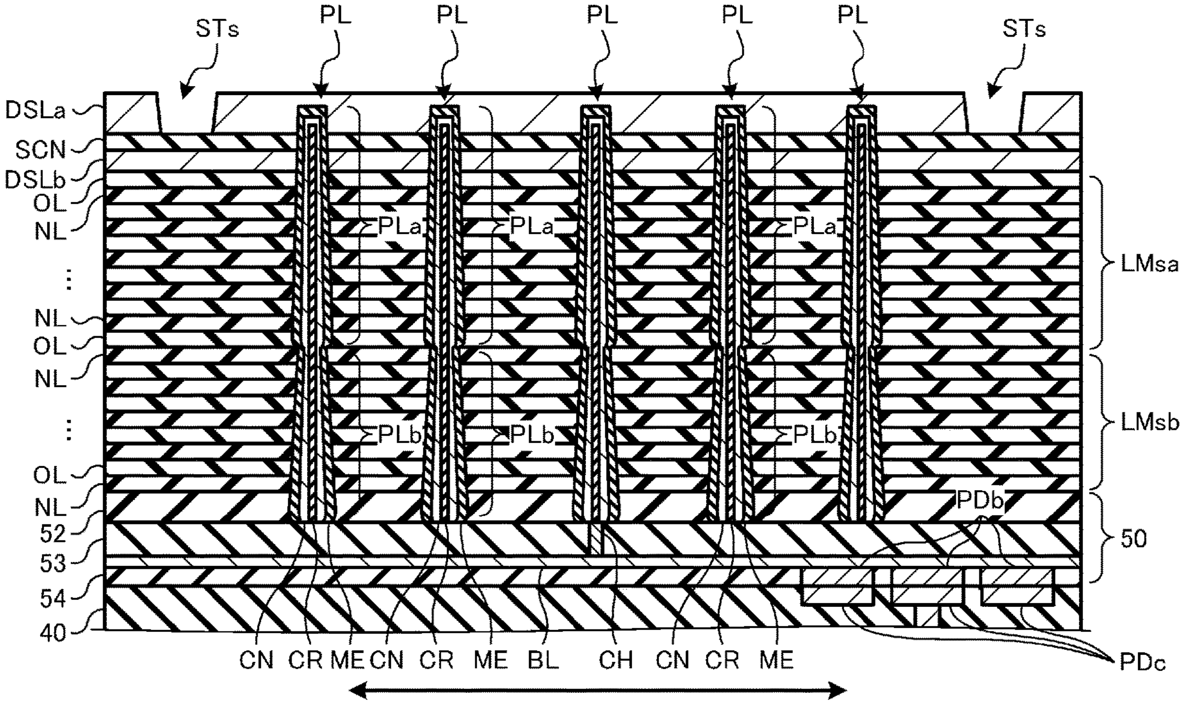
FIGS. 13A and 13B are diagrams partially and sequentially illustrating a procedure in the semiconductor storage device manufacturing method according to the embodiment.

As illustrated in FIG. 13A, a plurality of shallow grooves STs, which reach the intermediate sacrificial layer SCN by penetrating the source line DSLa, are formed at the positions of the memory region MR where the plate-shaped contacts LI are formed.

Figure 13B:
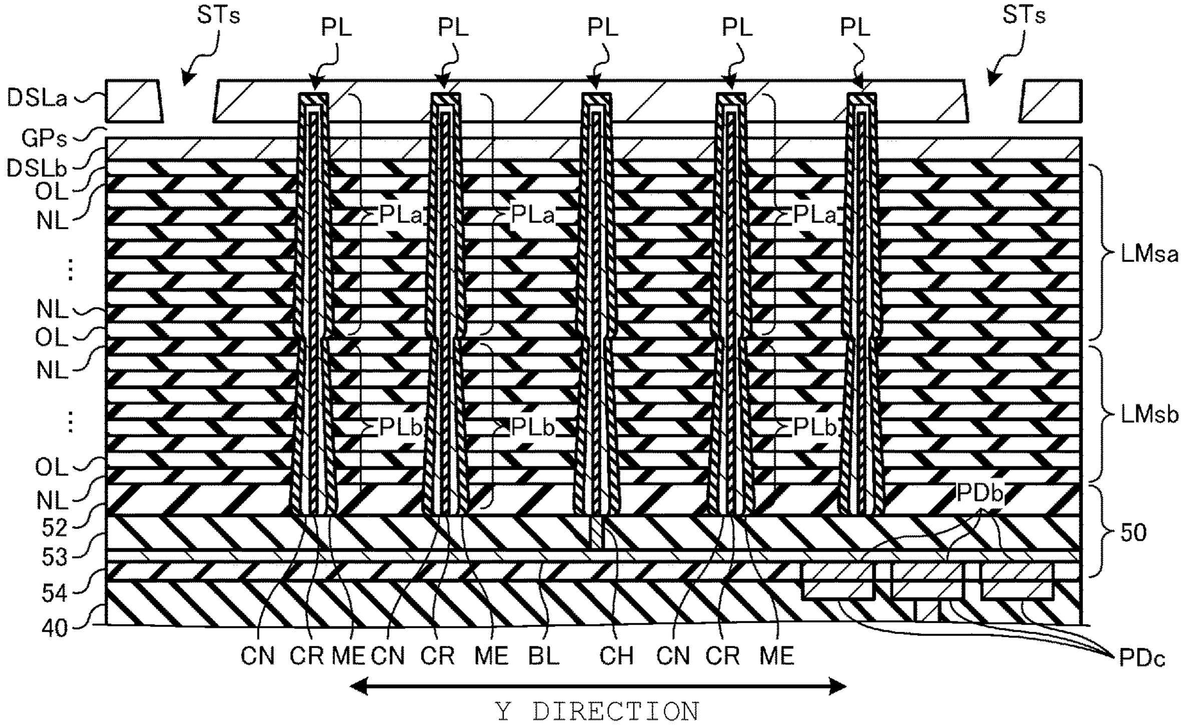

As illustrated in FIG. 13B, a remover for the intermediate sacrificial layer SCN, such as hot phosphoric acid, is caused to flow in from the plurality of shallow grooves STs to remove the intermediate sacrificial layer SCN. As a result, a gap layer GPs is formed between the source lines DSLa and DSLb. In addition, a part of the memory layer ME at the outer peripheral portion of the pillar PL is exposed to the gap layer GPs.

Figure 14A:
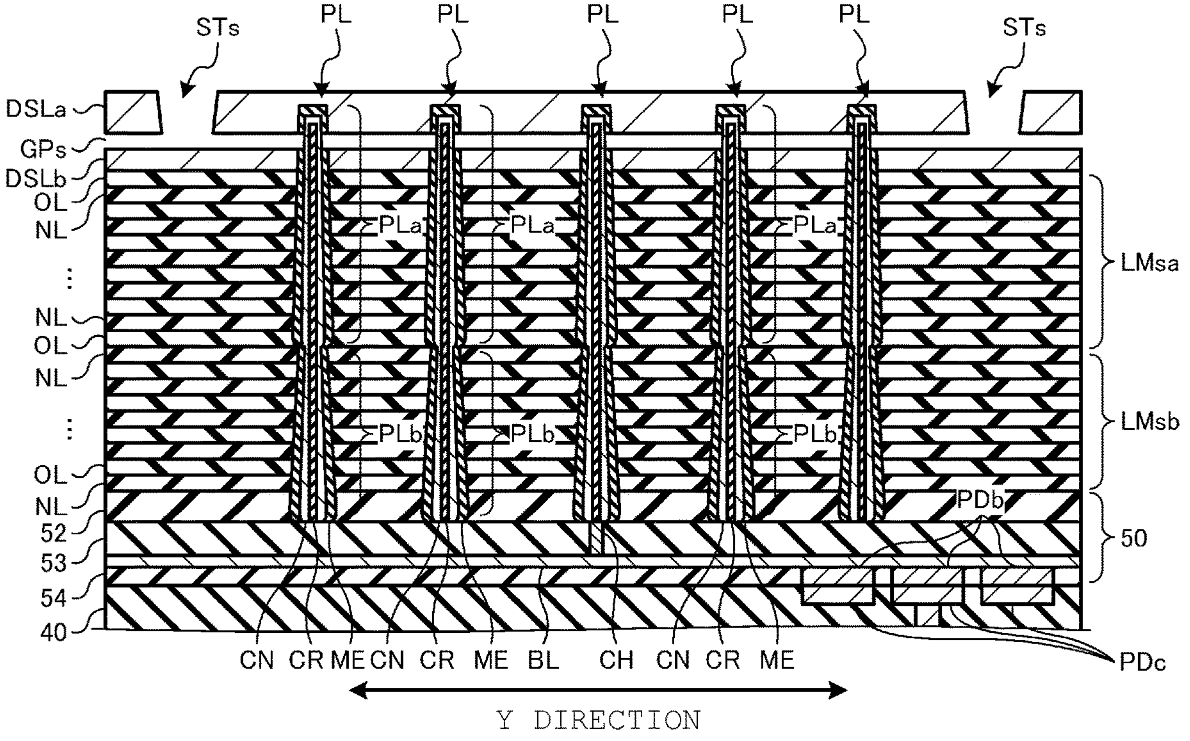
FIGS. 14A and 14B are diagrams partially and sequentially illustrating a procedure in the semiconductor storage device manufacturing method according to the embodiment.

As illustrated in FIG. 14A, a chemical solution is caused to appropriately flow into the gap layer GPs via the plurality of shallow grooves STs to remove the memory layer ME exposed to the gap layer GPs. As a result, a partial side wall of the inside channel layer CN is exposed to the gap layer GPs.

Figure 14B:
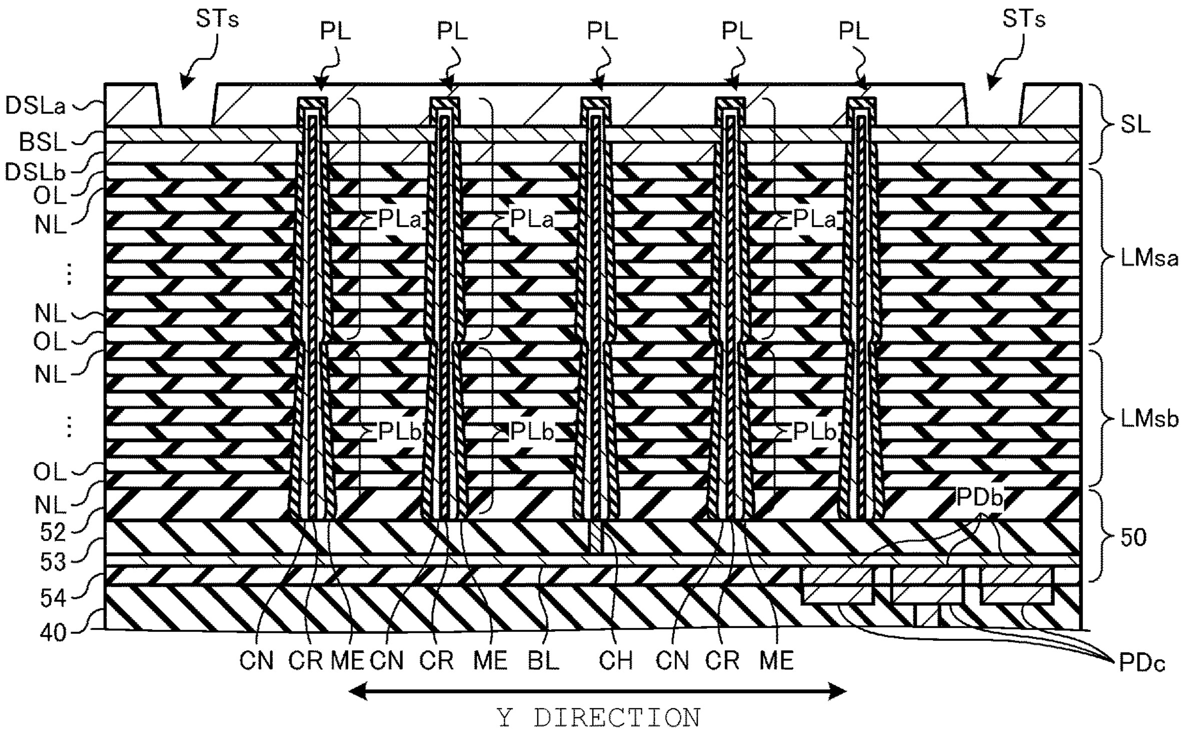

As illustrated in FIG. 14B, a raw material gas such as amorphous silicon is injected from the plurality of shallow grooves STs to fill the gap layer GPs with amorphous silicon or the like. In addition, heating treatment is performed on the semiconductor substrate SB to polycrystallize the amorphous silicon with which the gap layer GPs is filled and form the intermediate source line BSL containing polysilicon or the like.

As a result, a part of the channel layer CN of the pillar PL is connected to the source line SL on the side surface via the intermediate source line BSL.

It should be noted that the columnar portion HR, which is a dummy pillar, preferably has no conductivity with the source line SL. As described above, in the stair region SR and so on except for the memory region MR, the intermediate insulating layer SCO is disposed without the intermediate sacrificial layer SCN being disposed between the source line DSLa and the source line DSLb. Therefore, during the treatment of FIGS. 13A to 14B, removal of the intermediate sacrificial layer SCN, removal of the dummy layer MEd of the columnar portion HR, formation of the intermediate source line BSL, and the like are not performed in the stair region SR.

Next, FIGS. 15A to 16B illustrate how to form the word line WL and the plate-shaped contact LI. FIGS. 15A to 16B also illustrate a cross section along the Y direction of the memory region MR that is in the process of manufacturing.

Figure 15A:
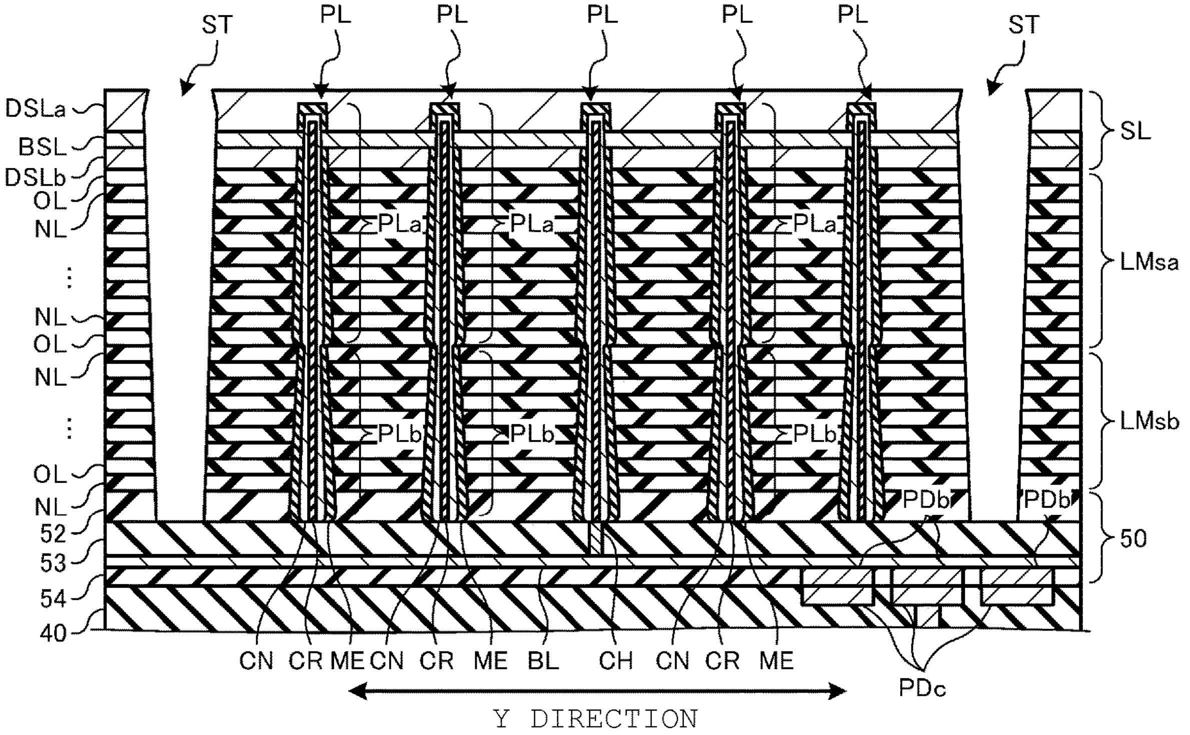
FIGS. 15A and 15B are diagrams partially and sequentially illustrating a procedure in the semiconductor storage device manufacturing method according to the embodiment.

As illustrated in FIG. 15A, a plurality of slits ST, which reach the insulating layer 53 from the upper surface of the source line SL by etching, such that the source line SL, the stacked bodies LMsa and LMbs, and the insulating layer 52 are penetrated, are formed at the positions where the shallow grooves STs are formed. The plurality of slits ST also extend in the direction along the X direction in the stacked bodies LMsa and LMbs.

The plurality of slits ST have, for example, a tapered shape in which the width in the Y direction decreases from the upper surface side of the source line SL toward the lower surface side of the stacked body LMsb.

The plurality of slits ST may have a bow shape to have the maximum width in the Y direction between the end portion on the upper surface side of the source line SL and the end portion on the lower surface side of the stacked body LMsb. In this case, the plurality of slits ST are formed such that the width in the Y direction decreases toward the lower end portion from the part with the maximum width in the Y direction.

Figure 15B:
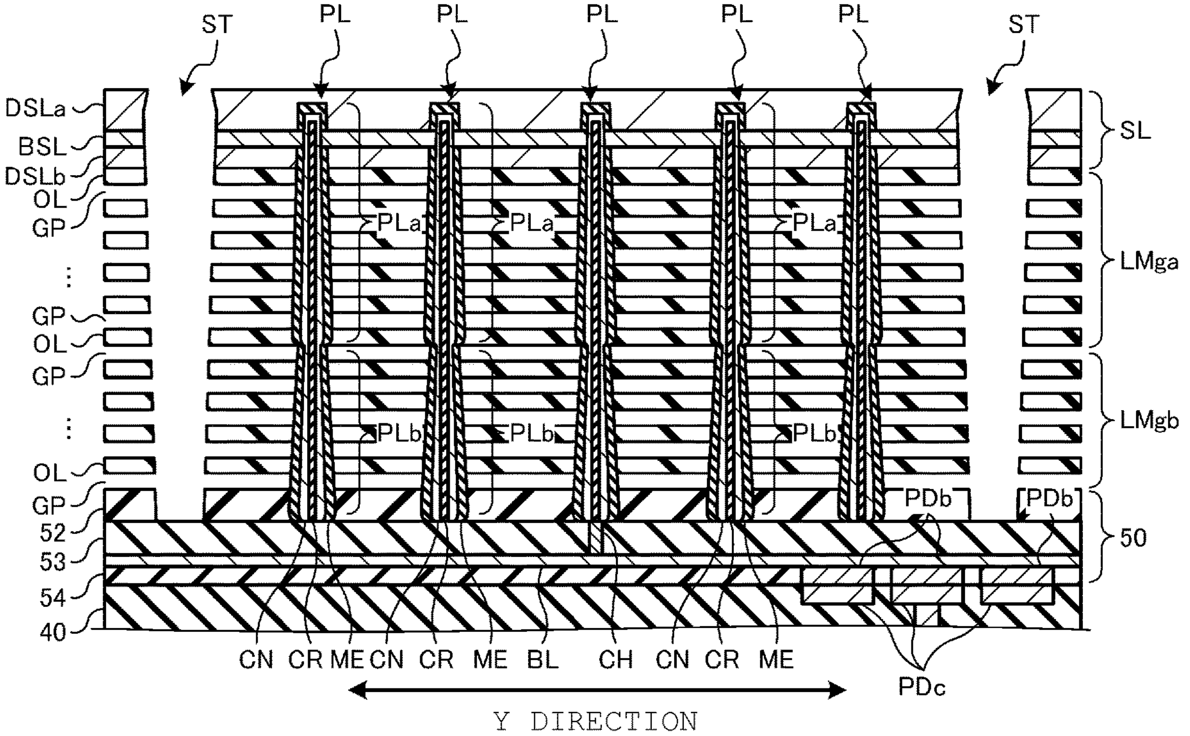

As illustrated in FIG. 15B, a remover for the insulating layer NL, such as hot phosphoric acid, is caused to flow into the stacked bodies LMsa and LMsb from the slits ST penetrating the stacked bodies LMsa and LMsb to remove the insulating layers NL of the stacked bodies LMsa and LMsb. Formed as a result are stacked bodies LMga and LMgb having a plurality of gap layers GP from which the insulating layers NL between the insulating layers OL are removed.

It should be noted that the stacked bodies LMga and LMgb including the plurality of gap layers GP have a fragile structure. In the memory region MR, the plurality of pillars PL support such fragile stacked bodies LMga and LMgb. In the stair region SR, the plurality of columnar portions HR support the stacked bodies LMga and LMgb. By such a supporting structure of the pillar PL and the columnar portion HR, bending of the remaining insulating layer OL and distortion and collapse of the stacked bodies LMga and LMgb are prevented.

Figure 16A:
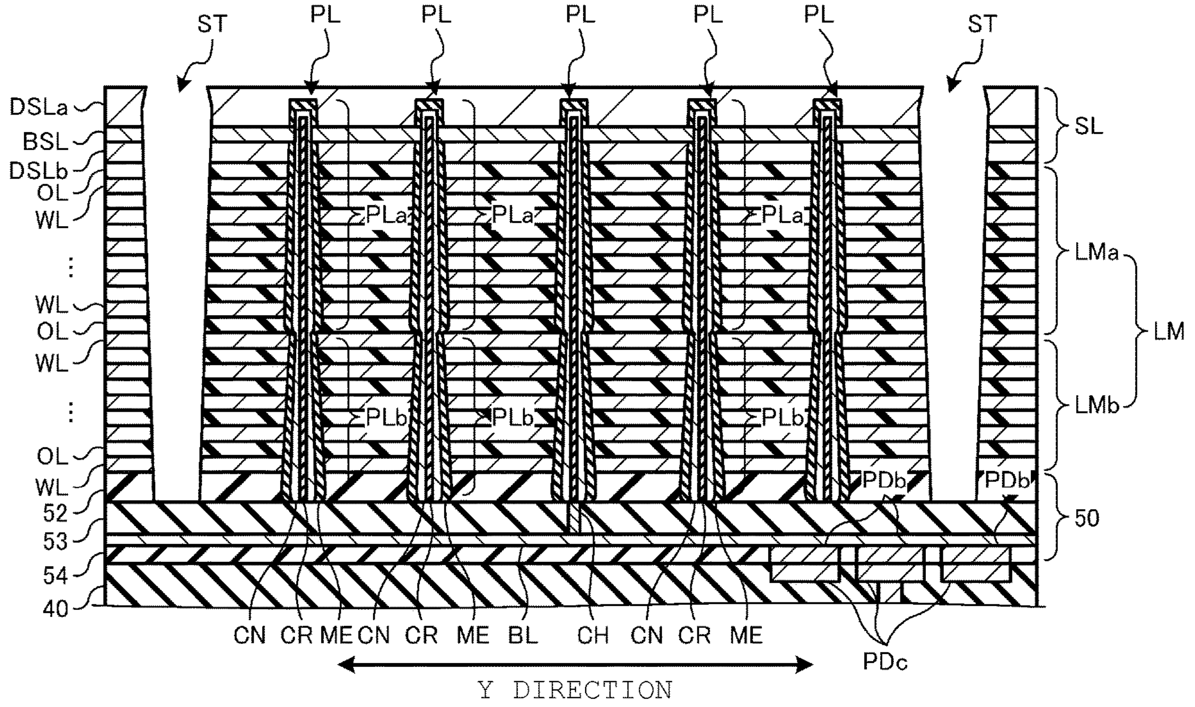
FIGS. 16A and 16B are diagrams partially and sequentially illustrating a procedure in the semiconductor storage device manufacturing method according to the embodiment.

As illustrated in FIG. 16A, a raw material gas of a conductive material such as tungsten and molybdenum is injected from the slit ST into the stacked bodies LMga and LMgb to fill the gap layers GP of the stacked bodies LMga and LMgb with the conductive material and form the plurality of word lines WL. Formed as a result is the stacked body LM in which the plurality of word lines WL and the plurality of insulating layers OL are alternately stacked layer by layer.

In addition, by forming the word line WL from the insulating layer NL in the stair region SR as well, the plurality of contacts CC and the plurality of word lines WL corresponding thereto are electrically connected.

The treatment of forming the intermediate source line BSL from the intermediate sacrificial layer SCN as described above and the treatment of forming the word line WL from the insulating layer NL as described above are also called replace treatment.

Figure 16B:
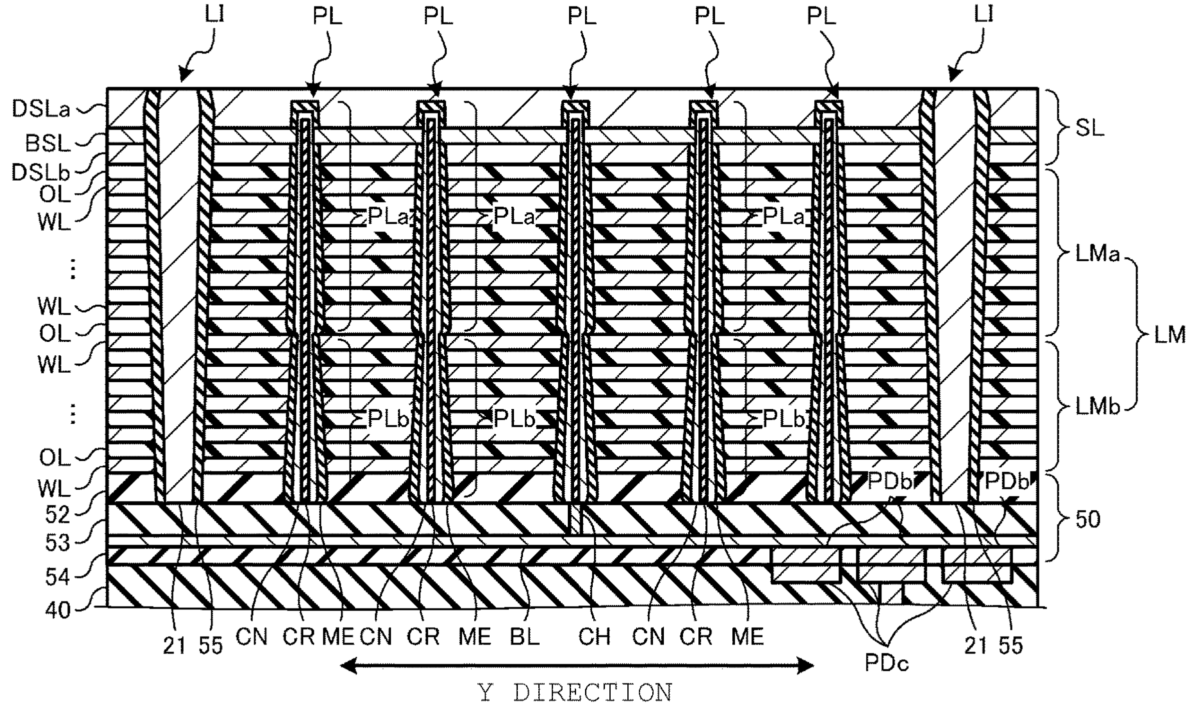

As illustrated in FIG. 16B, the insulating layer 55 is formed on the side walls of the slit ST facing each other in the Y direction and the insulating layer 55 is filled with the conductive layer 21. The plate-shaped contact LI is formed as a result.

The plate-shaped contact LI is electrically connected to the wiring MX formed in the insulating layer 54 via the plug VO formed in the insulating layer 53 in the stair region SR.

As described above, the plate-shaped contact LI is formed by processing, for example, the stacked bodies LMsa and LMsb from the upper surface of the source line SL. In addition, in this manner, the plate-shaped contact LI and the pillar PL are processed from different sides in the stacking direction with respect to, for example, the stacked bodies LMsa and LMsb.

Subsequently, a polysilicon layer or the like is formed on the source line DSLa to pile up the source line DSLa. As a result, the upper surface of the plate-shaped contact LI is covered with the source line DSLa, and the upper surface of the plate-shaped contact LI and the source line SL can be electrically connected.

In addition, the insulating layer 60 is formed on the source line SL and the plug PG (see FIGS. 2A to 2D) penetrating the insulating layer 60 is formed. In addition, the conductive layer 20 (see FIG. 1) is formed on the insulating layer 60. As a result, the source line SL and the conductive layer 20 are electrically connected via the plug PG.

The semiconductor storage device 1 of the embodiment is manufactured as a result of the above.

Overview

A semiconductor storage device such as a three-dimensional nonvolatile memory has, for example, a pillar, a columnar portion supporting a stacked body, and a plate-shaped portion for performing replace treatment. These configurations are densely disposed in the stacked body so that the semiconductor storage device is miniaturized.

A memory hole, a hole, and a slit that become the pillar, the columnar portion, and the plate-shaped portion are usually formed from the same side of the stacked body in the stacking direction. However, in forming the memory hole, the hole, and the slit, these may have a tapered shape or a bow shape. Therefore, the maximum width parts thereof are disposed side by side at the same hierarchical position of the stacked body, and the maximum width parts of the pillar and the columnar portion formed in the vicinity of the slit may come into contact with the maximum width part of the slit.

In forming the slit, if the slit comes into contact with the pillar and the columnar portion and a silicon nitride layer, such as a charge storage layer, in the pillar and the columnar portion is exposed in the slit, the silicon nitride layer is replaced with a conductive layer as a result of the replace treatment, which may lead to a short circuit with a word line in the vicinity of the pillar and the columnar portion. Further, plate-shaped contact formation by conductive layer embedding in the slit may lead to a short circuit between the replacing conductive layer of the pillar and the columnar portion and the plate-shaped contact.

In forming the slit, if the slit comes into contact with the pillar and the columnar portion and a semiconductor layer, such as a channel layer, in the pillar and the columnar portion is exposed in the slit, a short circuit with the conductive layer embedded in the slit may occur.

According to the semiconductor storage device 1 of the embodiment, the plate-shaped contact LI has the maximum width in the Y direction on one end side of the stacked body LM in the stacking direction and the pillar PL and the columnar portion HR have the maximum width in the Y direction at a position away in the stacking direction from the one end side of the stacked body LM. In other words, the tapered part of the plate-shaped contact LI and the tapered part of the pillar PL and the columnar portion HR are tapered in opposite directions.

In this manner, in the plate-shaped contact LI and the pillar PL and the columnar portion HR, the parts with the maximum width in the Y direction are disposed at positions mutually deviating from the same hierarchical position of the stacked body LM. As a result, inter-configuration contact can be prevented.

According to the semiconductor storage device 1 of the embodiment, the plate-shaped contact LI has a tapered part decreasing in width in the Y direction from one end side of the stacked body LMa in the stacking direction toward the other end side of the stacked body LMb in the stacking direction, and the pillar PL has the pillar PLa extending in the stacking direction in the stacked body LMa and having a tapered part increasing in width in the Y direction from one end side toward the other end side of the stacked body LMa and the pillar PLb extending in the stacking direction in the stacked body LMb and having a tapered part increasing in width in the Y direction from one end side toward the other end side of the stacked body LMb.

Nowadays, two-tier structures in which the pillar PL is configured in two stages and has the plurality of pillars PLa and PLb are used in some cases. Even in this case, each of the maximum width parts of these pillars PLa and PLb and the maximum width part of the plate-shaped contact LI are disposed at positions deviating from the same hierarchical position of the stacked body LM. The same applies to a case where the columnar portion HR is configured in two stages and has the plurality of columnar portions HRa and HRb. As a result, inter-configuration contact can be prevented.

According to the method for manufacturing the semiconductor storage device 1 of the embodiment, the stacked bodies LMsa and LMsb are processed from one end side in the stacking direction of the stacked bodies LMsa and LMsb to form the pillar PL and the columnar portion HR extending in the stacking direction in the stacked bodies LMsa and LMsb. In addition, the stacked bodies LMsa and LMsb are processed from the other end side in the stacking direction of the stacked bodies LMsa and LMsb to form the plate-shaped contact LI extending in the stacking direction of the stacked bodies LMsa and LMsb and the direction along the X direction.

By processing the stacked bodies LMsa and LMsb from different sides and forming the plate-shaped contact LI, the pillar PL, and the columnar portion HR in this manner, the maximum width parts of the plate-shaped contact LI and the pillar PL and the columnar portion HR can be disposed at positions mutually deviating from the same hierarchical position of the stacked body LM. As a result, inter-configuration contact can be prevented.

According to the method for manufacturing the semiconductor storage device 1 of the embodiment, in forming the pillar PL, the stacked bodies LMsa and LMsb are processed from one end side that is the upper surfaces of the stacked bodies LMsa and LMsb while supporting the stacked bodies LMsa and LMsb with the supporting substrate SS. In forming the plate-shaped contact LI, one end side of the stacked bodies LMsa and LMsb is bonded to the semiconductor substrate SB via the peripheral circuit CBA and the stacked bodies LMsa and LMsb are processed from the other end side that is the upper surfaces of the stacked bodies LMsa and LMsb while supporting the stacked bodies LMsa and LMsb with the semiconductor substrate SB.

By using a bonding technique in this manner, it is possible to process the stacked bodies LMsa and LMsb from different sides and form the plate-shaped contact LI and the pillar PL and the columnar portion HR.

According to the method for manufacturing the semiconductor storage device 1 of the embodiment, the peripheral circuit CBA including the transistor TR is formed on the semiconductor substrate SB and one end side of the stacked bodies LMsa and LMsb is bonded to the semiconductor substrate SB via the peripheral circuit CBA.

Techniques for manufacturing a semiconductor storage device such as a three-dimensional nonvolatile memory using, for example, a bonding technique in this manner are being studied. By applying the technique of the embodiment, with which the plate-shaped contact LI and the pillar PL and the columnar portion HR are formed by processing the stacked bodies LMsa and LMsb from different sides in a semiconductor storage device manufactured by a bonding technique, the semiconductor storage device 1 can be inexpensively manufactured without an increase in process count and with inter-configuration contact prevented.

Other Modification Examples

Although the pillar PL in the embodiment described above is connected to the source line SL on the side surface of the channel layer CN, the present disclosure is not limited thereto. For example, the pillar may be configured to be connected to the source line at the lower end portion of the channel layer with the memory layer on the pillar bottom surface removed. In this case, the pillar has, on the source line side, a closed end with an end portion covered with the channel layer.

In addition, in the embodiment described above, the semiconductor storage device 1 is provided with the plate-shaped contact LI. However, the slit ST after the replace treatment may be filled with, for example, an insulating layer to form a plate-shaped portion that does not function as a source line contact. Even in this case, it is possible to solve the above problem arising during the replace treatment by preventing from contacting between the plate-shaped portion and the pillar PL and the columnar portion HR using the technique described above.

It should be noted that in a case where the plate-shaped portion is configured with an insulating layer or the like, the above treatment of piling up the source line DSLa and covering the upper surface of the plate-shaped portion does not have to be performed.

In addition, in the embodiment described above, the columnar portion HR has the same layer structure as the pillar PL. However, the stacked body LMg and the like may be supported by a columnar portion that has a layer structure different from the pillar PL. As the layer structure different from the pillar PL, the columnar portion can be configured with a single insulating layer such as a silicon oxide layer.

In this case, a void may be formed in the columnar portion due to incomplete insulating layer filling. The columnar portion having the void may come into contact with the slit ST and the void of the columnar portion may be exposed in the slit ST, and then a conductive layer such as a tungsten layer may be formed in the columnar portion during the replace treatment to cause a short circuit with the surrounding word line WL. In addition, in forming the plate-shaped contact LI from the slit ST, the conductive layer 21 of the plate-shaped contact LI is formed in the void of the columnar portion as well, which may also cause a short circuit with the surrounding word line WL.

Therefore, even in a case where the columnar portion is configured with a single insulating layer or the like, contact between the columnar portion and the plate-shaped contact LI can be prevented by applying the above technique and the semiconductor storage device being affected in terms of electrical characteristics can be prevented.

In addition, in the embodiment described above, the insulating layers NL and OL are stacked in two divided sessions to form the two-tier stacked body LM including the stacked bodies LMa and LMb. However, the stacked body may have a one-tier structure or a structure with three tiers or more. By increasing the tier count, the stacking count of the word line WL can be further increased.

When the stacked body has a one-tier structure, the plate-shaped contact has a tapered part decreasing in width in the Y direction from one end side toward the other end side of the stacked body and the pillar and the columnar portion have tapered parts increasing in width in the Y direction from one end side toward the other end side of the stacked body. Also in such a configuration, in the plate-shaped contact and the pillar and the columnar portion, the parts with the maximum width in the Y direction can be disposed at positions mutually deviating from the same hierarchical position of the stacked body.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:

a stacked body where a conductive layer and an insulating layer are stacked multiple number of times from a bottom of the stacked body to a top of the stacked body;

a plate-shaped portion extending along a stacking direction of the stacked body and a first direction intersecting the stacking direction and dividing the stacked body along a second direction intersecting the stacking direction and the first direction; and a memory pillar penetrating the stacked body and extending along the stacking direction, wherein a width of the plate-shaped portion in the second direction at the same height as a conductive layer located at the top of the stacked body is larger than a width of the plate-shaped portion in the second direction at the same height as a conductive layer located at the bottom of the stacked body, and a width of the memory pillar in the second direction at the same height as the conductive layer located at the top of the stacked body is smaller than a width of the memory pillar in the second direction at the same height as the conductive layer located at the bottom of the stacked body, wherein a width of the memory pillar in the second direction at a first position of the memory pillar is smaller than a width of the memory pillar in the second direction at a second position of the memory pillar, and a width of the memory pillar in the second direction at a third position of the memory pillar is smaller than a width of the memory pillar in the second direction at a fourth position of the memory pillar, and the second position of the memory pillar is farther from a top of the memory pillar than the first position of the memory pillar, the third position of the memory pillar farther from the top of the memory pillar than the second position of the memory pillar, and the fourth position of the memory pillar farther from the top of the memory pillar than the third position of the memory pillar.

2. The semiconductor storage device according to claim 1, wherein the width of the memory pillar in the second direction at the second position is larger than the width of the memory pillar in the second direction at the third position.

3. The semiconductor storage device according to claim 1, further comprising:

a dummy pillar penetrating the stacked body and extending along the stacking direction, wherein a width of the dummy pillar in the second direction at the same height as the conductive layer located at the top of the stacked body is smaller than a width of the dummy pillar in the second direction at the same height as the conductive layer located at the bottom of the stacked body.

4. The semiconductor storage device according to claim 3, wherein the memory pillar has a maximum width in the first direction that is smaller than a maximum width in the first direction of the dummy pillar.

5. The semiconductor storage device according to claim 1, wherein the memory pillar includes a charge storage layer, and a voltage is applied to the charge storage layer through the conductive layer, which is a word line.

6. The semiconductor storage device according to claim 1, further comprising:

a peripheral circuit including a transistor on the bottom of the stacked body.

7. A semiconductor storage device comprising:

a stacked body where a conductive layer and an insulating layer are stacked multiple number of times from a bottom of the stacked body to a top of the stacked body;

a plate-shaped portion extending along a stacking direction of the stacked body and a first direction intersecting the stacking direction and dividing the stacked body along a second direction intersecting the stacking direction and the first direction; and a memory pillar penetrating the stacked body, extending along the stacking direction, and including a core layer, wherein a width of the plate-shaped portion in the second direction at the same height as a conductive layer located at the top of the stacked body is larger than a width of the plate-shaped portion in the second direction at the same height as a conductive layer located at the bottom of the stacked body, and a width of the core layer in the second direction at the same height as the conductive layer located at the top of the stacked body is smaller than a width of the core layer in the second direction at the same height as the conductive layer located at the bottom of the stacked body.

8. The semiconductor storage device according to claim 7, further comprising:

a dummy pillar penetrating the stacked body and extending along the stacking direction, wherein a width of the dummy pillar in the second direction at the same height as the conductive layer located at the top of the stacked body is smaller than a width of the dummy pillar in the second direction at the same height as the conductive layer located at the bottom of the stacked body.

9. The semiconductor storage device according to claim 8, wherein the memory pillar has a maximum width in the first direction that is smaller than a maximum width in the first direction of the dummy pillar.

10. The semiconductor storage device according to claim 7, wherein the memory pillar further includes a charge storage layer, and a voltage is applied to the charge storage layer through the conductive layer, which is a word line.

11. The semiconductor storage device according to claim 7, further comprising a peripheral circuit including a transistor on the bottom of the stacked body.

* * * * *